(12) United States Patent
Zhang

(10) Patent No.: US 11,910,678 B1
(45) Date of Patent: Feb. 20, 2024

(54) DISPLAY PANEL AND DISPLAY DEVICE

(71) Applicant: Wuhan Tianma Micro-Electronics Co., Ltd., Wuhan (CN)

(72) Inventor: Wenshuai Zhang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 18/110,900

(22) Filed: Feb. 17, 2023

(30) Foreign Application Priority Data

Nov. 28, 2022 (CN) .......................... 202211502712.4

(51) Int. Cl.
*G09G 3/3208* (2016.01)
*H10K 59/131* (2023.01)

(52) U.S. Cl.
CPC ......... *H10K 59/131* (2023.02); *G09G 3/3208* (2013.01); *G09G 2300/0852* (2013.01); *G09G 2310/0202* (2013.01); *G09G 2310/0297* (2013.01); *G09G 2320/02* (2013.01)

(58) Field of Classification Search
CPC .............. H10K 59/131; G09G 3/3208; G09G 2300/0852; G09G 2310/0202; G09G 2310/0297; G09G 2320/02
See application file for complete search history.

(56) References Cited

U.S. PATENT DOCUMENTS

2020/0406397 A1* 12/2020 Roh ..................... B32B 37/144

* cited by examiner

*Primary Examiner* — Abbas I Abdulselam
(74) *Attorney, Agent, or Firm* — Anova Law Group, PLLC

(57) ABSTRACT

A display panel including a display area including a first display area and a second display area; and a non-display area at least partially surrounding the display area, the non-display area including a first fan-out area located on one side of the display area along a first direction, the first fan-out area including a plurality of fan-out lines the second display area being located on at least one side of the first display area along a second direction, both the first display area and the second display area including a plurality of data lines extending along the first direction and arranged along the second direction, the data lines being electrically connected the fan-out lines, the data lines in the second display area being electrically connected to the fan-out lines through a connecting line.

20 Claims, 26 Drawing Sheets

C-C

DISPLAY PANEL AND DISPLAY DEVICE

CROSS-REFERENCE TO RELATED APPLICATIONS

The present application claims the priority of Chinese Patent Application No. 202211502712.4, filed on Nov. 28, 2022, the content of which is incorporated herein by reference in its entirety.

TECHNICAL FIELD

The present disclosure relates to the field of display technology and, more specifically, to a display panel and a display device.

BACKGROUND

From the cathode ray tube (CRT) era to the liquid crystal display (LCD) era, and now to the organic light-emitting diode (OLED) era and the light-emitting diode display era, the display industry has experienced many changes in the last few decades. The display industry is closely tied to our lives as display technology is being used in traditional electronic devices such as mobile phones, tablets, televisions, and personal computers, and newly developed electronic devices such as smart wearable devices, virtual reality devices, car displays, etc.

With the development of display technology, users have higher and higher requirements for the display products. For example, narrowing the frame of display products is a development trend at this stage, and there is a need to effectively realize the narrow frame design of display products.

SUMMARY

One aspect of the present disclosure provides a display panel. The display panel includes a display area including a first display area and a second display area, and a non-display area at least partially surrounding the display area. The non-display area includes a first fan-out area located on one side of the display area along a first direction, and the first fan-out area includes a plurality of fan-out lines. The second display area is located on at least one side of the first display area along a second direction. Both the first display area and the second display area include a plurality of data lines extending along the first direction and arranged along the second direction. The data lines are electrically connected to the fan-out lines, and the data lines in the second display area are electrically connected to the fan-out lines through a connecting line. The connecting line is located in the display area and includes a first connecting line segment extending along the first direction and a second connecting line segment extending along the second direction. The first connecting line segment is electrically connected to the fan-out line, and the second connecting line segment is electrically connected to the data line in the second display area. Along a thickness direction of the display panel, the first connecting line segment at least partially overlaps with the data line in the first display area.

Another aspect of the present disclosure provides a display device. The display device includes a display panel. The display panel includes a display area including a first display area and a second display area, and a non-display area at least partially surrounding the display area. The non-display area includes a first fan-out area located on one side of the display area along a first direction, and the first fan-out area includes a plurality of fan-out lines. The second display area is located on at least one side of the first display area along a second direction. Both the first display area and the second display area include a plurality of data lines extending along the first direction and arranged along the second direction. The data lines are electrically connected to the fan-out lines, and the data lines in the second display area are electrically connected to the fan-out lines through a connecting line. The connecting line is located in the display area and includes a first connecting line segment extending along the first direction and a second connecting line segment extending along the second direction. The first connecting line segment is electrically connected to the fan-out line, and the second connecting line segment is electrically connected to the data line in the second display area. Along a thickness direction of the display panel, the first connecting line segment at least partially overlaps with the data line in the first display area.

BRIEF DESCRIPTION OF THE DRAWINGS

In order to illustrate the technical solutions in accordance with the embodiments of the present disclosure more clearly, the accompanying drawings to be used for describing the embodiments are introduced briefly in the following. It is apparent that the accompanying drawings in the following description are only some embodiments of the present disclosure. Persons of ordinary skill in the art can obtain other accompanying drawings in accordance with the accompanying drawings without any creative efforts.

DETAILED DESCRIPTION OF THE EMBODIMENTS

Figure 1:
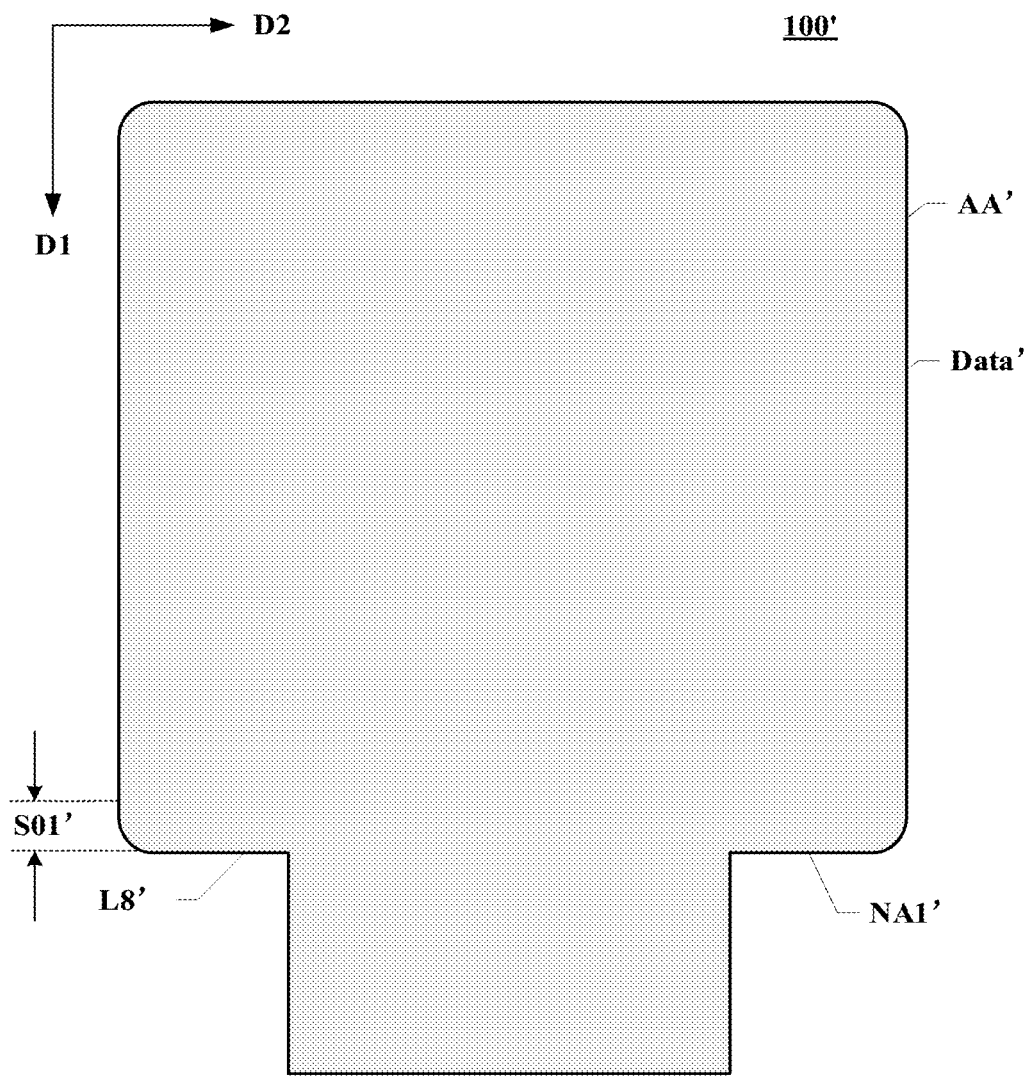
FIG. 1 is a schematic structural diagram of a display panel.

Various exemplary embodiments of the present disclosure are described in detail with reference to the drawings. It should be noted that relative arrangement of components and steps, numerical expressions and values clarified in the embodiments are not intended to limit the scope of the present disclosure, unless otherwise specified.

The following description of the at least one exemplary embodiment is merely illustrative and shall not be constructed as any limitation on the present disclosure and its application or use.

Techniques, methods and apparatus known to those skilled in the art may not be discussed in detail, but the techniques, methods and apparatus should be considered as a part of the specification where appropriate.

In all of the examples shown and discussed herein, any specific values are to be construed as illustrative only rather than limitation. Thus, different values may be used in other examples of the exemplary embodiments.

It is apparent for those skilled in the art that various modifications and variations may be made in the present application without departing from the spirit or scope of the present application. Accordingly, the present application is intended to cover modifications and variations of the present application that fall within the scope of the appended claims (the claimed technical solutions) and their equivalents. It should be noted that the embodiments of the present application, if not in contradiction, may be combined with one another.

It should be noted that similar reference numerals and letters indicate similar items in the following drawings. Therefore, once an item is defined in one drawing, the item is unnecessary to be further discussed in subsequent drawings.

FIG. 1 is a schematic structural diagram of a display panel 100'. As shown, the display panel 100' includes a display area AA' and a fan-out area NA1' located on one side of the display area AA'. The display area includes a plurality of data lines Data'. The plurality of data lines Data' extend along a first direction D1 and are arranged along a second direction D2. The fan-out area NA1' is located on one side of the display area AA' along the first direction D1. Each data line Data' extends to the bottom of the display area AA' and is electrically connected to a fan-out line L8'. Since the data lines on the left and right sides of the display area need to be electrically connected to the fan-out line L8', the fan-out line L8' connected to the data lines Data' located on both sides of the display area will be arranged at the lower left frame and the lower right frame of the display panel. The larger the space occupied by the fan-out line L8' along the second direction D2, the more unfavorable it is for the narrowing of the lower frame of the display panel. Typically, the width S01' of the lower frame of the display panel is substantially 1.7 mm, which is difficult to be further narrowed due to the current design of the display panel.

In view of the foregoing, embodiments of the present disclosure provide a display panel. The display panel may include a display area and a non-display area at least partially surrounding the display area. The non-display area may include a first fan-out area located on one side of the display area along a first direction, and the first fan-out area may include a plurality of fan-out lines. The display area may include a first display area and a second display area. The second display area may be located on at least one side of the first display area along a second direction, and the first direction and the second direction may intersect. Both the first display area and the second display area may include a plurality of data lines extending along the first direction and arranged along the second direction, and the data lines may be electrically connected to the fan-out lines. The data lines in the second display area may be electrically connected to the fan-out lines through a connecting line. The connecting line may be located in the display area and include a first connecting line segment extending along the first direction and a second connecting line segment extending along the second direction. The first connecting line segment may be electrically connected to the fan-out lines, and the second connecting line segment may be electrically connected to the data lines in the second display area. Along the thickness direction of the display panel, the first connecting line segment may at least partially overlap with the data lines in the first display area. By introducing the connecting line into the display area, the data lines in the second display area can be electrically connected to the fan-out lines in the first fan-out area through the second connecting line segment extending along the second direction and the first connecting line segment extending along the first direction in the connecting line. Further, along the thickness direction of the display panel, the first connecting line segment connected to the fan-out line may at least partially overlap with the data lines in the first display area. In this way, there is no need to route the fan-out lines close to the lower left and/or lower right borders of the display panel, thereby providing a compressed space for the borders of the display panel and the display device, which is beneficial to realizing the further narrow frame design of the display panel and the display device, and improving the user experience.

The foregoing describes the core concept of the present disclosure. The technical solutions in the embodiments of the disclosure will be described clearly and fully below in conjunction with the accompanying drawings in. All other embodiments obtained by those skilled in the art based on the embodiments in the disclosure without creative efforts shall fall within the protection scope of the present disclosure.

Figure 2:
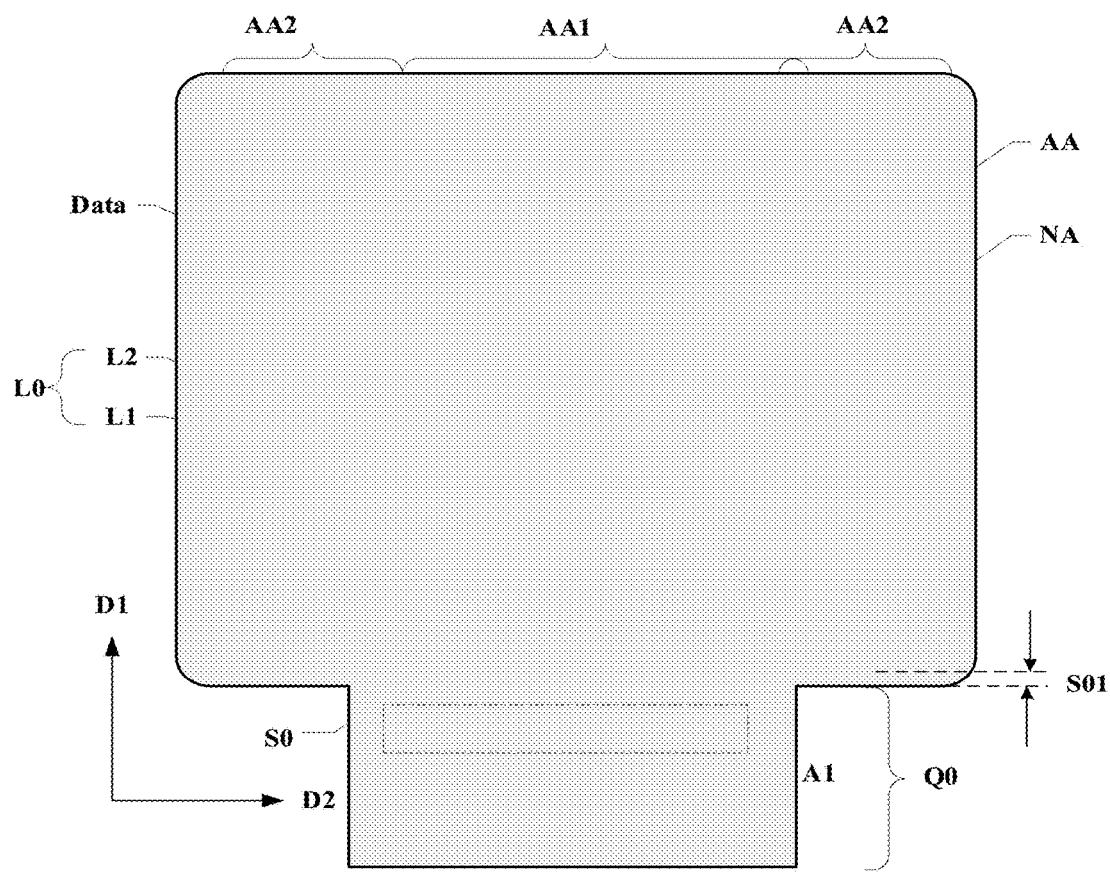
FIG. 2 is a schematic structural diagram of the display panel according to an embodiment of the present disclosure.
Figure 3:
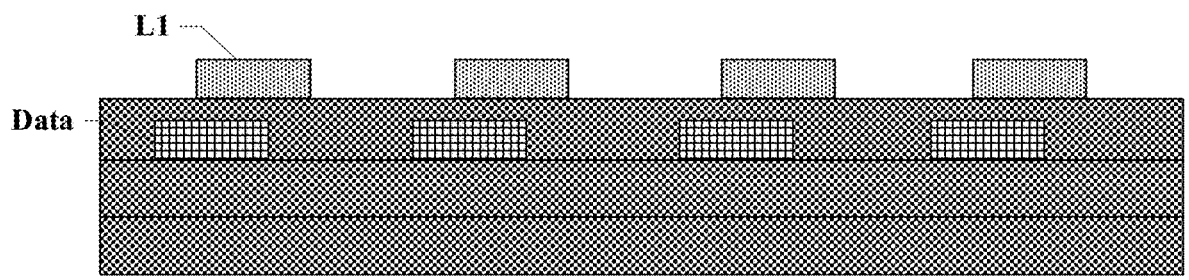
FIG. 3 is a schematic diagram of a B-B direction film layer of the display panel in FIG. 2.

FIG. 2 is a schematic structural diagram of a display panel 100 according to an embodiment of the present disclosure, and FIG. 3 is a schematic diagram of a film layer in a B-B direction of the display panel in FIG. 2. Referring to FIG. 2 and FIG. 3, the display panel 100 includes a display area AA and a non-display area NA at least partially surrounding the display area AA. The non-display area NA includes a first fan-out area A1 located on one side of the display area AA along a first direction D1, and the first fan-out area A1 includes a plurality of fan-out lines S0. The display area AA includes a first display area AA1 and a second display area AA2. The second display area AA2 is located on at least one side of the first display area AA1 along a second direction D2, and the first direction D1 and the second direction D2 intersect. Both the first display area AA1 and the second display area AA2 include a plurality of data lines Data extending along the first direction D1 and arranged along the second direction D2, and the data lines Data can be electrically connected to the fan-out lines S0. In some embodiments, the data lines Data in the second display area AA2 may be electrically connected to the fan-out lines S0 through a connecting line L0. The connecting line L0 is located in the display area AA, and includes a first connecting line segment L1 extending along the first direction D1 and a second connecting line segment L2 extending along the second direction D2. The first connecting line segment L1 may be electrically connected to the fan-out lines S0, and the second connecting line segment L2 may be electrically connected to the data lines Data in the second display area AA2. In addition, along the thickness direction of the display panel, the first connecting line segment L1 may at least partially overlap with the data lines Data in the first display area AA1.

It should be noted that FIG. 2 only illustrates the data lines Data includes in the display panel, and does not limit the number of data lines Data actually included in the display panel. Similarly, the number of data lines Data included in the first display area AA1 and the second display area AA2 shown in FIG. 2 is only for illustration, and does not represent the actual number of data lines Data included in the first display area AA1 and the second display area AA2. In the embodiments of the present disclosure, the first display area AA1 may be located in the middle area of the display panel, and the second display area AA2 may be located on one or both sides of the display panel along the second direction D2. In FIG. 2, the second display area AA2 is arranged on both sides of the first display area AA1 as an example. The second display area AA2 is adjacent to the edge of the display panel extending along the first direction D1, that is, the data lines Data in the second display area AA2 are located on both sides of the display area AA along the second direction D2, and the data lines Data in the first display area AA1 are located in the middle area of the display area AA. Similarly, in FIG. 2, the fan-out lines S0 in the first fan-out area A1 are only for illustration, and do not represent the number of fan-out lines S0 actually included in the first fan-out area A1. In addition, FIG. 3 only schematically shows part of the film layers of the display panel, and does not limit the actual film layer structure included in the display panel. Further, the film layer structure where the first connecting line segment L1 and the data lines Data area located is only for illustration, and does not limit the actual film layer where the first connecting line segment L1 and the data lines Data in the first display area AA1 are located.

Figure 4:
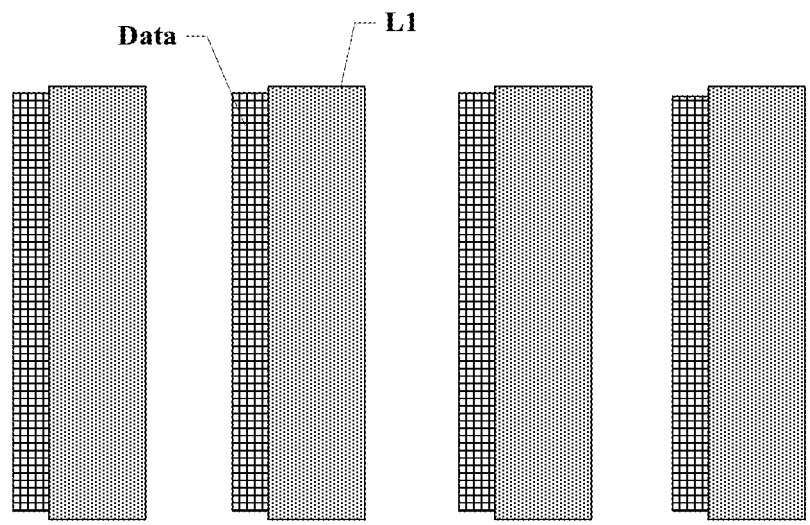
FIG. 4 is a relative positional relationship diagram of a first connecting line segment and a data line.

It should also be noted that FIG. 2 only schematically shows the approximate positions of the first connecting line segment L1 and the second connecting line segment L2 in the connecting line L0 in the display area AA. In order to better distinguish the first connecting line segment L1 from the data lines Data in the first display area AA1 in FIG. 2, the overlapping relationship between the first connecting line segment L1 and the data lines Data in the first display area AA1 is not shown in FIG. 2. In fact, the orthographic projection of the first connecting line segment L1 and the data lines Data in the first display area AA1 on the display panel may be at least partially overlapped. Referring to FIG. 4, which is a relative positional relationship diagram of the first connecting line segment and the data line. In some embodiments, the direction along the thickness of the display panel mentioned in the embodiments of the present disclosure can be understood as a direction perpendicular to the light-emitting surface of the display panel, or as a direction perpendicular to the plane where the substrate in the display panel is located. In some embodiments, the display panel may include a substrate, and other film layer structures of the display panel may be formed on at least one side of the substrate.

Referring to FIG. 2, FIG. 3, and FIG. 4. In the display panel provided by the embodiments of the present disclosure, the second display area AA2 in the display area AA may be located on at least one side of the first display area AA1 along the second direction D2, and the first fan-out area A1 may be arranged on one side of the display area AA along the first direction D1. The position where the data lines Data in the first display area AA1 directly extend to the first fan-out area A1 may be electrically connected to the fan-out lines S0 in the first fan-out area A1. The data lines Data in the second display area AA2 may be electrically connected to the fan-out lines S0 in the first fan-out area A1 through the connecting line L0 in the display area AA. In the connecting line L0, the second connecting line segment L2 extending along the second direction D2 may be electrically connected to the data lines Data in the second display area AA2, and the first connecting line segment L1 extending along the first direction D1 may be electrically connected to the fan-out lines S0 in the first fan-out area A1. In addition, along the thickness direction of the display panel, the first connecting line segment L1 connected to the fan-out lines S0 may at least partially overlap with the data lines Data in the first display area AA1. That is, among the plurality of first connecting line segments L1 corresponding to the data lines Data in the second display area AA2, a part of the line segments may be located in the second display area AA2 for electrically connecting with the data lines Data in the second display area AA2, and another part of the line segments may be located in the first display area AA1 for electrically connecting with the fan-out lines S0, and these two parts of the line segments may be electrically connected to each other. The ling segments of the data lines Data in the first display area AA1 close to the first fan-out area A1 may directly extend from the first display area AA1 to the first fan-out area A1 and may be electrically connected to the fan-out lines S0. In addition, along the thickness direction of the display panel, the first connecting line segment L1 connected to the fan-out lines S0 may at least partially overlap with the data lines Data in the first display area AA1. In this way, the data lines Data in the first display area AA1 and the second display area AA2 can be electrically connected to the fan-out lines S0 in the first fan-out area A1 through the line segments located in the first display area AA1. Therefore, there is no need to route the fan-out lines S0 close to the lower left and/or lower right borders of the display panel, thereby providing a compressed space for the frame of the display panel. By using the technical solution provided in the present disclosure, the width S01 of the lower frame of the display panel will be less than 1 mm. Compared with the method in which the width of the lower frame is 1.7 mm in the related art, the width of the lower frame is greatly reduced, which is beneficial to realizing a further narrow frame design of the display panel and improving the user experience.

In some embodiments, the display panel may include a stepped area Q0, and the control chip may be arranged in the stepped area Q0. In actual application, the stepped area Q0 can be folded to the non-light-emitting surface of the display panel, thereby reducing the width of the lower frame of the display panel.

Figure 5:
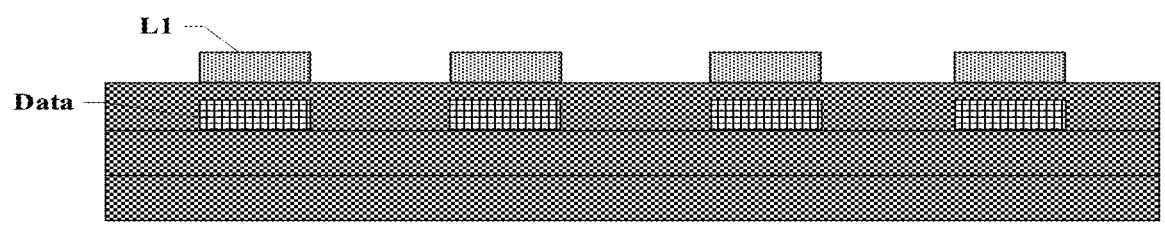
FIG. 5 is a schematic diagram of the B-B direction film layer of the display panel in FIG. 2.

It should be noted that the embodiment shown in FIG. 3 only shows the technical solution that the first connecting line segment L1 at least partially overlap and at least partially non-overlap with the data lines Data in the first display area AA1. In some other embodiments of the present disclosure, such as in FIG. 5, which is a schematic diagram of the B-B direction film layer of the display panel in FIG. 2, the first connecting line segment L1 and the data lines Data in the first display area AA1 may also be arranged to completely overlap (when the line width of the first connecting line segment L1 and the data lines Data in the first display area AA1 are consistent). In this way, the space occupied by the signal lines in the display panel can be effectively reduced, and the aperture ratio of the display panel can be increased.

Figure 6:
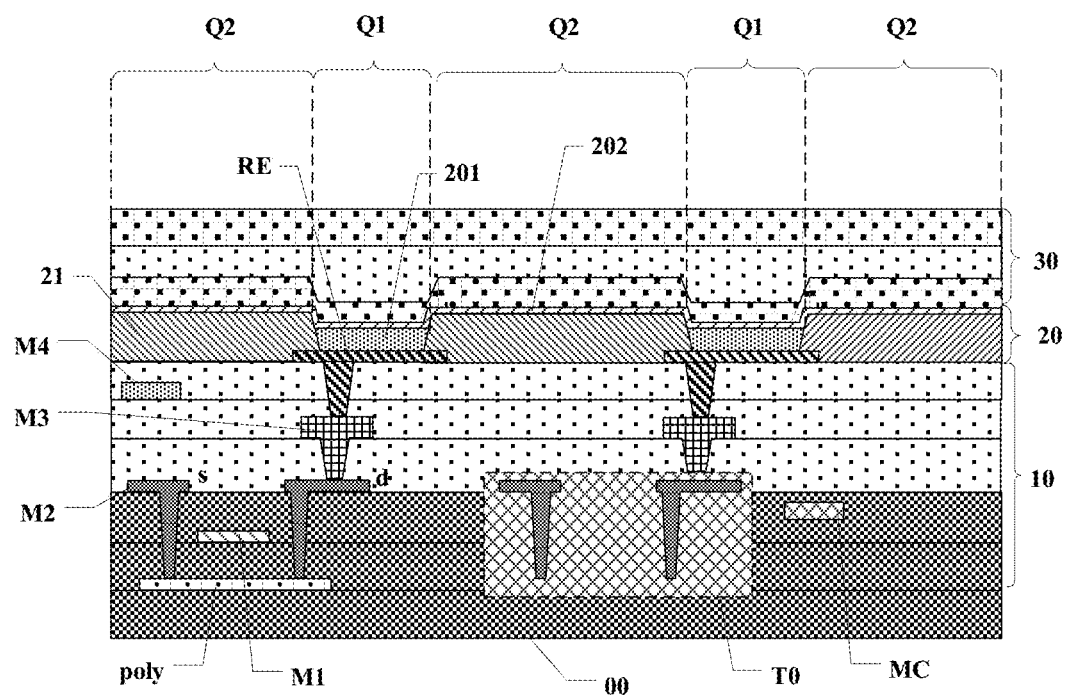
FIG. 6 is a schematic diagram of a film layer of the display panel according to an embodiment of the present disclosure.

FIG. 6 is a schematic diagram of a film layer of the display panel according to an embodiment of the present disclosure. In some embodiments, the display panel provided in this embodiment may be a display panel using organic light-emitting diode display technology, that is, an OLED display panel. From the perspective of film layer structure, the display panel includes a substrate 00, an array layer 10, a light-emitting layer 20, and an encapsulation layer 30. In some embodiments, the array layer 10 may include a plurality of transistors T0, and the basic structure of the light-emitting layer of the OLED display panel generally include an anode RE, a light-emitting material layer 201, and a cathode 202. When the power supplies an appropriate voltage, the holes of the anode RE and the electrons of the cathode 202 will combine in the light-emitting material layer 201 to produce light. In some embodiments, the encapsulation layer 30 may include a first inorganic layer 301, an organic layer 302, and a second inorganic layer 303, which can be used to encapsulate the light-emitting layer 20, thereby avoiding the influence of external eater and oxygen on the light-emitting layer 20. Compared with thin-film field-effect transistor liquid crystal displays, OLDE display devices have the characteristics of high visibility and high brightness, and are energy-efficient, lighter, and thinner. Of course, in some other embodiments of the present disclosure, the display panel can also be a display panel using inorganic light-emitting diode display technology, such as a micro-LED display panel, a mini-LED display panel, etc.

Figure 7:
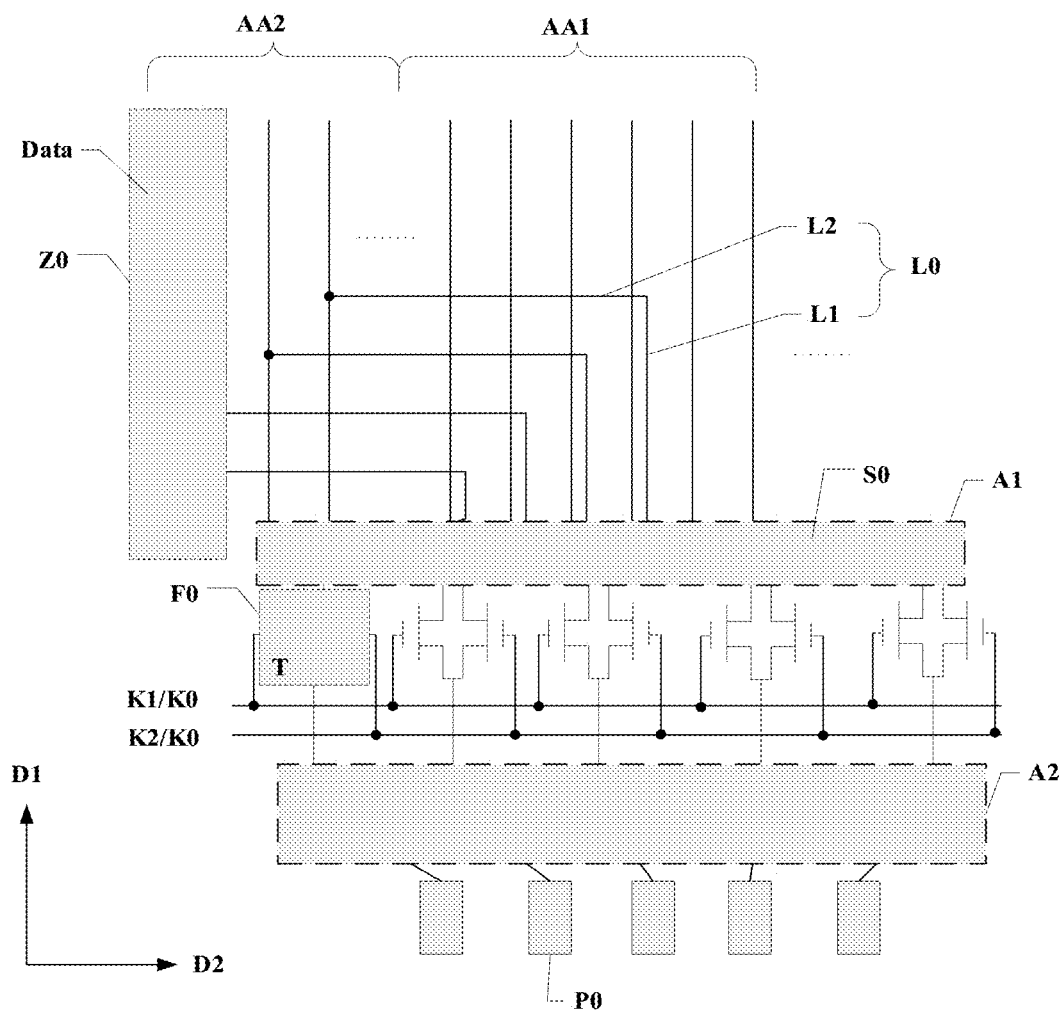
FIG. 7 is a schematic diagram of a connection between the data line and a demultiplexing unit in the display panel according to an embodiment of the present disclosure.

FIG. 7 is a schematic diagram of a connection between the data line Data and a demultiplexing unit F0 in the display panel according to an embodiment of the present disclosure. This embodiment illustrates the relative positional relationship of the data line Data, the first fan-out area A1, and the demultiplexing unit F0 in the display panel.

Referring to FIG. 2 and FIG. 7. In some embodiments, the display area AA of the display panel may include a plurality of data line groups Z0, and the data line group Z0 may include X data lines Data, where X≥2.

The display panel may further include a plurality of demultiplexing units F0, and the demultiplexing units F0 may be located on the side of the first fan-out area A1 away from the display area AA. The demultiplexing unit F0 may include X switching elements T, and the switching element T may include a control terminal, an input terminal, and an output terminal. The input terminals of the X switching elements T of the same demultiplexing unit F0 may be connected, and the output terminals of the X switching elements T of the same demultiplexing unit F0 may be connected to the X data lines Data of the same data line group Z0 in one-to-one correspondence. The data lines Data in the second display area AA2 may be connected to the output terminals of the switching elements T through the second connecting line segment L2 and the first connecting line segment L1.

The display panel may also include X switch control lines K0, and the control terminals of the X switching elements T of the demultiplexing unit F0 may be connected to the X switch control lines K0 in one-to-one correspondence.

In the first connecting line segment L1 at least partially overlapping along the thickness direction of the display panel and the data lines Data, the control terminal of the switching element T connected to the first connecting line segment L1 and the control terminal of the switching element T connected to the data line Data may be connected to the same switch control line K0.

Referring to FIG. 7. When display panel includes the demultiplexing unit F0, the first fan-out area A1 described in the embodiment of the present disclosure may refer to the area between the display area AA and the demultiplexing unit F0. One end of the fan-out lines S0 in the first fan-out area A1 close to the display area AA may be used for electrical connection with the data lines Data, and one end close to the demultiplexing unit F0 may be used for electrical connection with the demultiplexing unit F0. A second fan-out area A2 may also be arranged on the side of the demultiplexing unit F0 away from the display area AA, and a pad area may be arranged on the side of the second fan-out area A2 away from the display area AA. In some embodiments, the fan-out lines in the second fan-out area A2 may be used to electrically connect the input terminal of the switching element T in the demultiplexing unit F0 with a conductive pad P0 in the pad area. It should be noted that the electrical connection described in the embodiments of the present disclosure can be a direct connection between two connection bodies, or a signal connection formed between two connection bodies through other line segments, or a signal connection formed between two connection bodies through a switching element (such as a transistor), etc. For example, the signal connection between the fan-out line S0 and the data line Data in the second display area AA2 may be formed by connection the line L0, the fan-out line S0 may be directly connected with the data line Data in the first display area AA1, and the conductive pad P0 may be electrically connected to the data line Data through the switching element in the demultiplexing unit F0.

Figure 8:
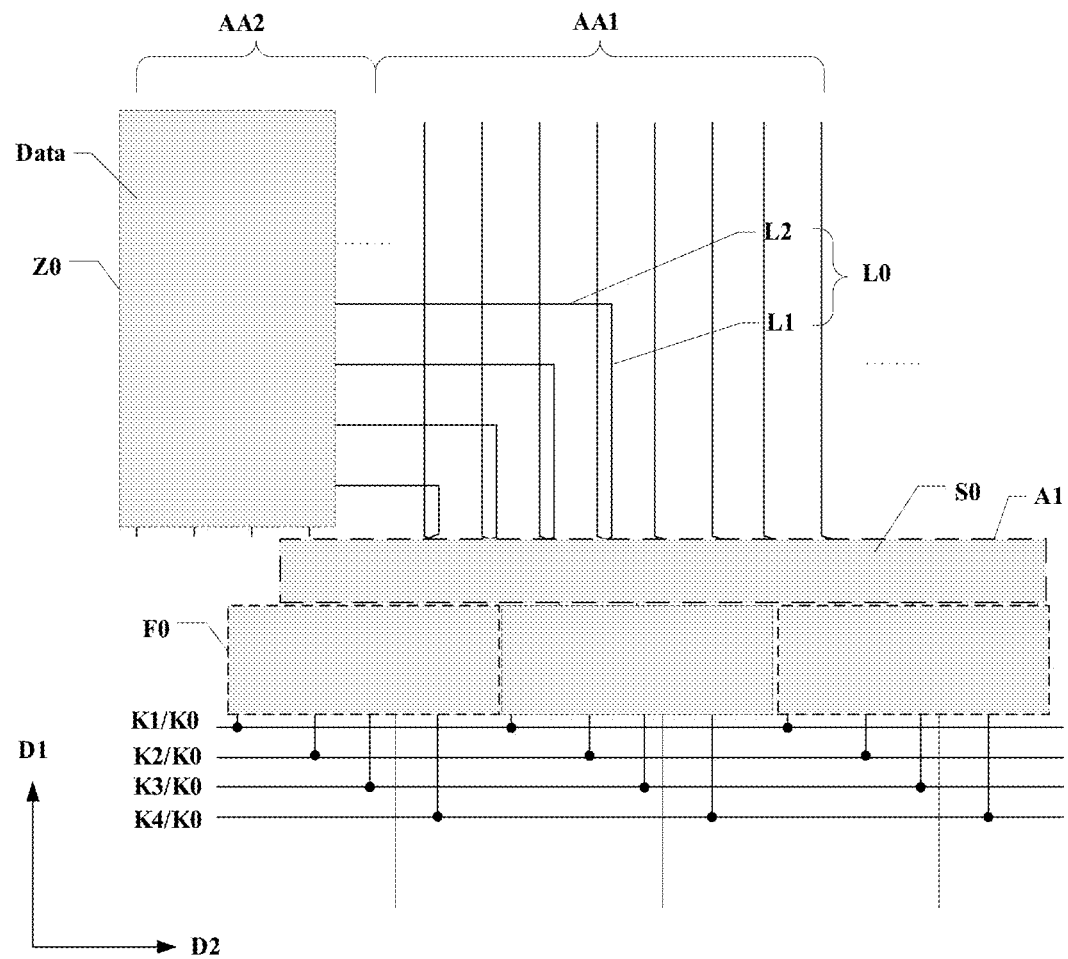
FIG. 8 is another schematic diagram of the connection between the data line and the demultiplexing unit in the display panel according to an embodiment of the present disclosure.

Referring to FIG. 7. In the embodiments of the present disclosure, the data line Data is divided into multiple data line groups Z0, and each data line group Z0 includes X data lines Data. This embodiment takes X=2 as an example for illustration. The switch control line K0 includes a first switch control line K1 and a second switch control line K2, and at the same time, a plurality of demultiplexing units F0 may be introduced into the display panel. The number of demultiplexing units F0 may be the same as the number of data line groups Z0, and the number of switching elements T included in the demultiplexing unit F0 may be the same as the number of data lines Data included in each data line group Z0. The X data lines Data in the same data line group Z0 may be respectively connected to the output terminals of the X switching elements T in the same demultiplexing unit F0, and the input terminals of the X switching elements T in the same demultiplexing unit F0 may be connected together for connecting to the same conductive pad P0 in the second fan-out area A2. The control terminals of the X switching elements T in the same demultiplexing unit F0 may be respectively connected to the X switch control lines K0 in one-to-one correspondence. By setting X first switching elements T corresponding to X data lines Data in a one-to-one correspondence, each first switching element T may independently control the signal transmission of the corresponding data line Data. In addition, by connecting the input terminals of the X first switching elements T of the same demultiplexing unit F0 together to be electrically connected to the same conductive pad P0, the number of fan-out lines S0 in the second fan-out area A2 and the number of conductive pads P0 in the bonding area can be reduced. In some embodiments, the conductive pad P0 in the bonding area may be used for bonding with the control chip. When the number of conductive pads P0 in the bonding area is reduced, the number of conductive pads on the control chip will also be reduced, thereby facilitating the simplification of the structure of the control chip bonded to the conductive pad P0. It should be noted that the X number of switching elements T included in each demultiplexing unit F0 can be set based on the number of data lines Data included in the data line group Z0, and this embodiment takes X=2 as an example for illustration. In some other embodiments of the present disclosure, X can also be other integer values greater than 2. Referring to FIG. 8, which is a schematic diagram of the connection between the data line and the demultiplexing unit in the display panel according to an embodiment of the present disclosure. In this embodiment, X=4 is taken as an example for illustration, and the switch control line includes a first switch control line K1, a second switch control line K2, a third switch control line K3, and a fourth switch control line K4.

In some embodiments, the switching element T in the demultiplexing unit F0 may be an NMOS transistor. When a high-level signal is applied to the control terminal of the NMOS transistor, the corresponding switching element T may be turned on; otherwise, when a low-level signal is applied to the control terminal of the NMOS transistor, the corresponding switching element T may be turned off.

In other embodiments, the switching element T in the demultiplexing unit F0 may also be selected as a PMOS transistor. When a low-level signal is applied to the control terminal of the PMOS transistor, the corresponding switching element T may be turned on; otherwise, when a high-level signal is applied to the control terminal of the PMOS transistor, the corresponding switching element T may be turned off.

In some embodiments, the X switching elements T in the same demultiplexing unit F0 may all be NMOS transistors or PMOS transistors.

Referring to FIG. 2, FIG. 3, FIG. 4, FIG. 5, and FIG. 7. When the first connecting line segment L1 is set to at least partially overlap with the data line Data in the first display area AA1, assuming that the at least partially overlapping first connecting line segment L1 and the data line Data from an overlapping unit, then in the same overlapping unit, the control terminal of the switching element T connected to the first connecting line segment L1 and the control terminal of the switching element T connected to the data line Data may be connected to the same switch control line K0. That is, the same switch control line K0 may control the simultaneous turn-on or simultaneous turn-off of the switch units corresponding to the first connecting line segment L1 and the overlapping data line Data. In this way, the simultaneous charging of the data line Data connected to the first connecting line segment L1 and the data line Data in the first display area AA1 can be realized. Therefore, when the first connecting line segment L1 and the data line Data int eh first display area AA1 are at least partially overlapped, the signals on the first connecting line segment L1 and the data line Data can both be data signals for charging the sub-pixels, thereby effectively avoiding the phenomenon of signal crosstalk caused by different transmitted signals on overlapping line segments.

Figure 9:
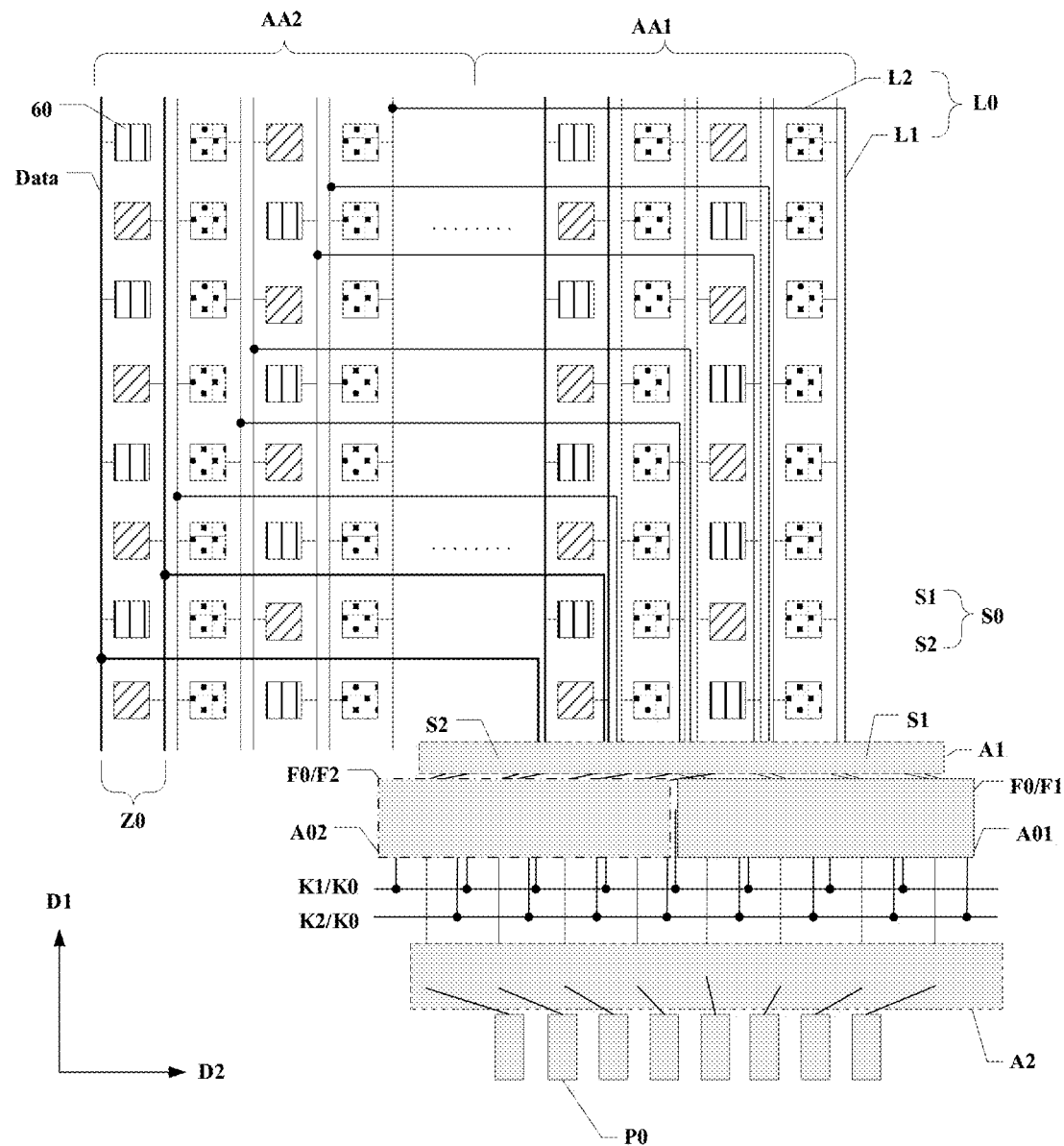
FIG. 9 is a schematic diagram of a connection between a pixel circuit and the data line in the display panel according to an embodiment of the present disclosure.
Figure 10:
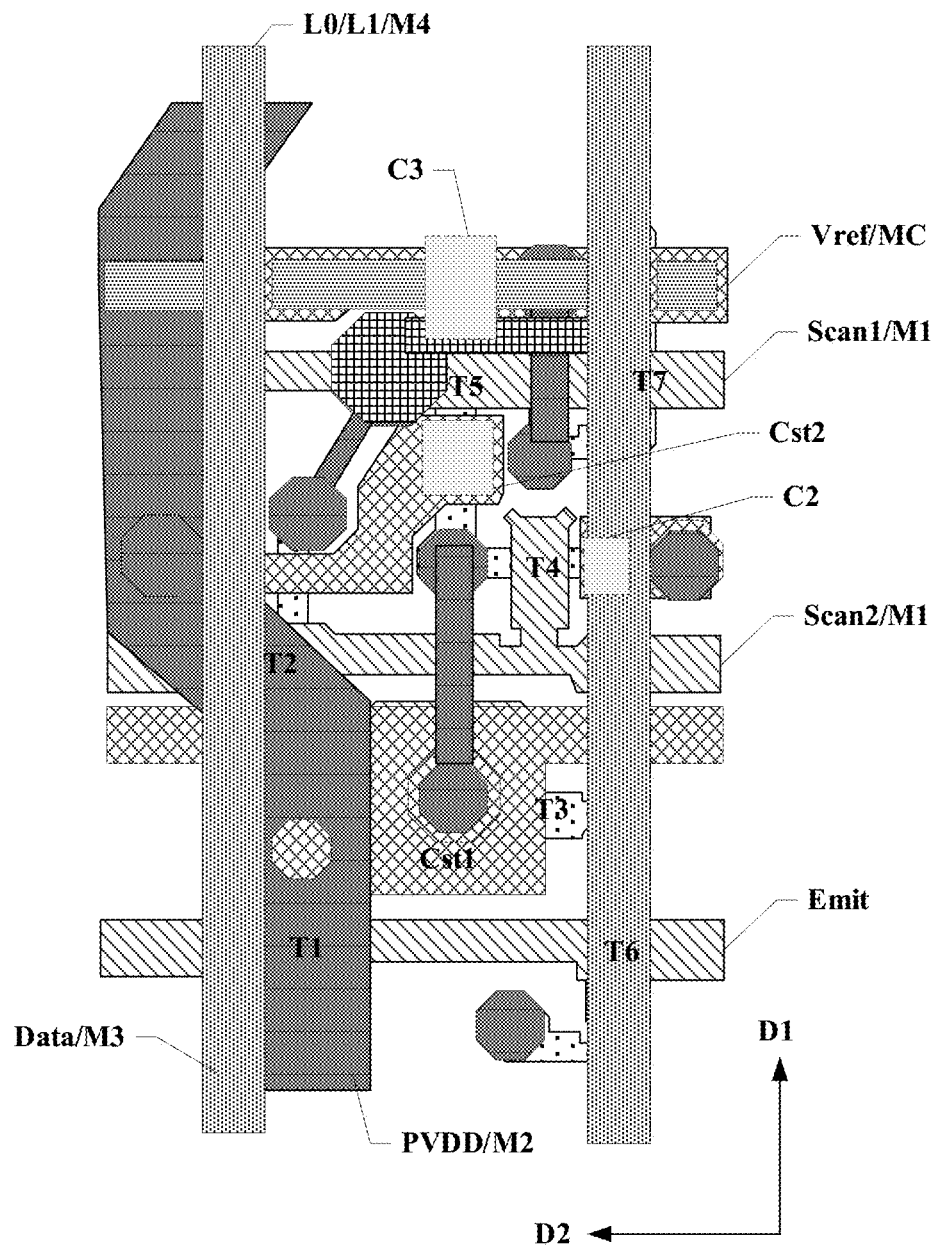
FIG. 10 is a schematic layout diagram of a pixel area where the pixel circuit in FIG. 9 is located.
Figure 11:
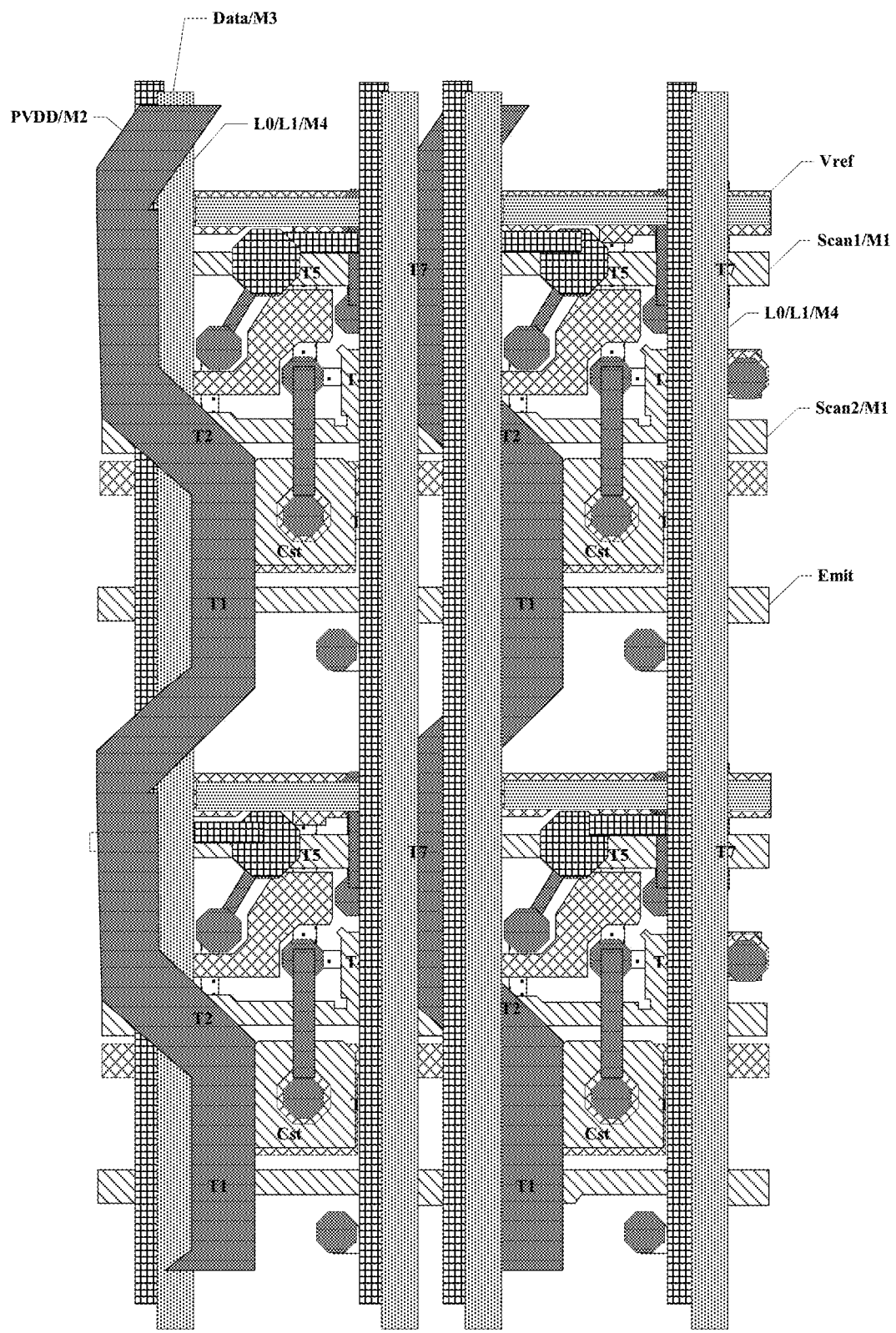
FIG. 11 is a schematic diagram of a layout of data lines in a 2*2 pixel area.
Figure 12:
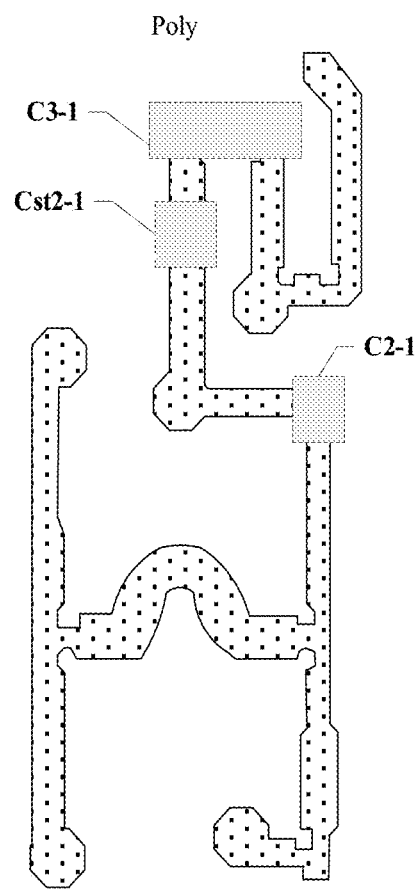
FIG. 12 is a schematic plan view of an active layer in the pixel area of FIG. 10.
Figure 13:
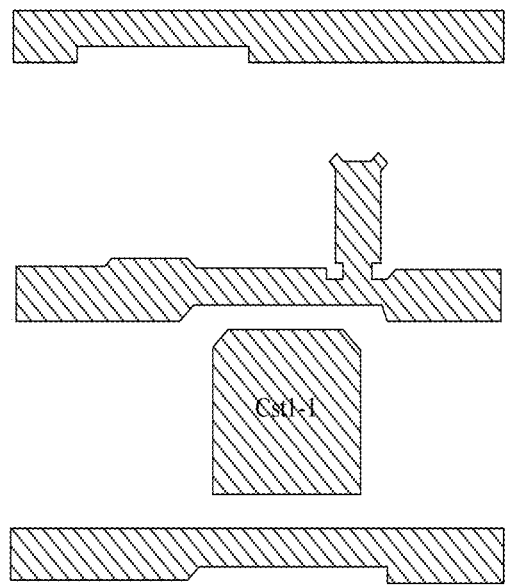
FIG. 13 is a schematic plan view of a first metal layer in the pixel area of FIG. 10.
Figure 14:
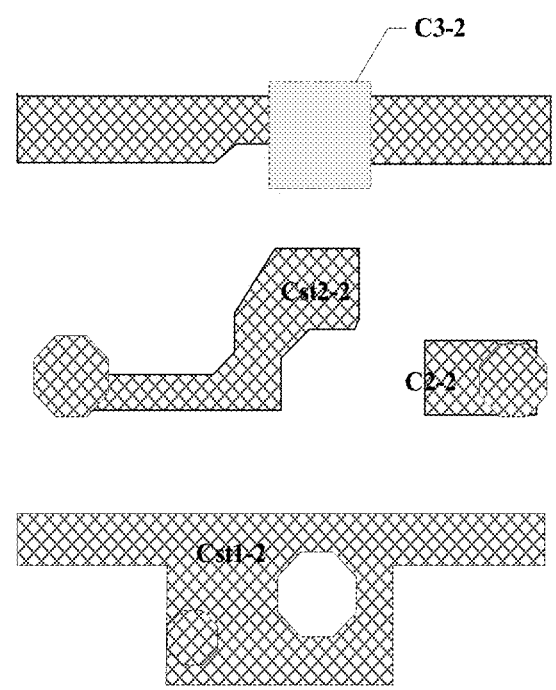
FIG. 14 is a schematic plan view of a capacitive metal layer in the pixel area of FIG. 10.
Figure 15:
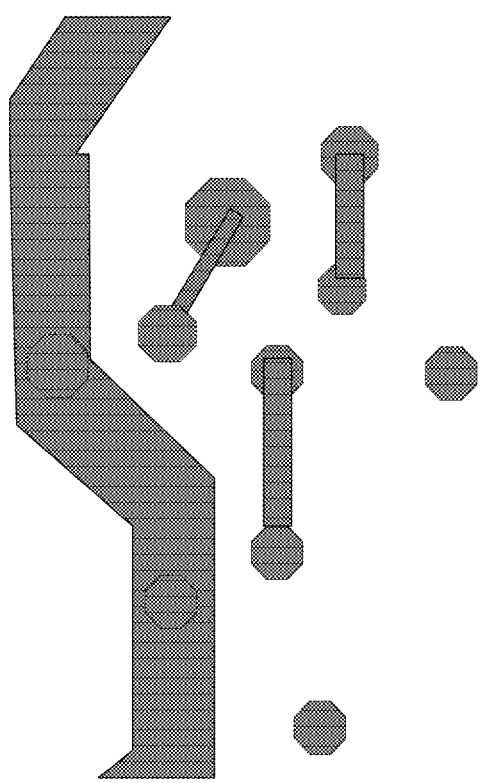
FIG. 15 is a schematic plan view of a second metal layer in the pixel area of FIG. 10.
Figure 16:
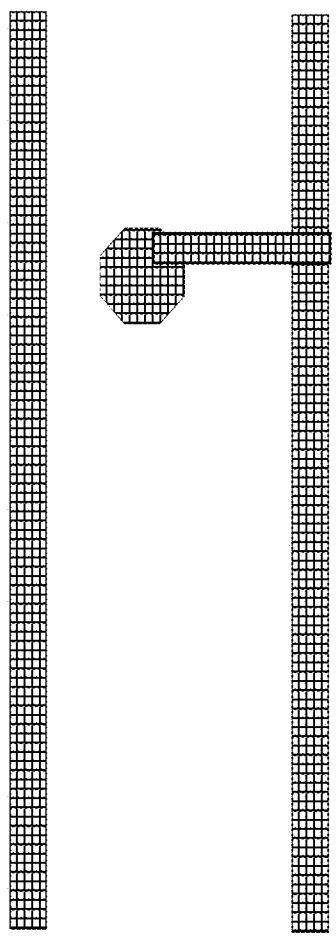
FIG. 16 is a schematic plan view of a third metal layer in the pixel area of FIG. 10.
Figure 17:
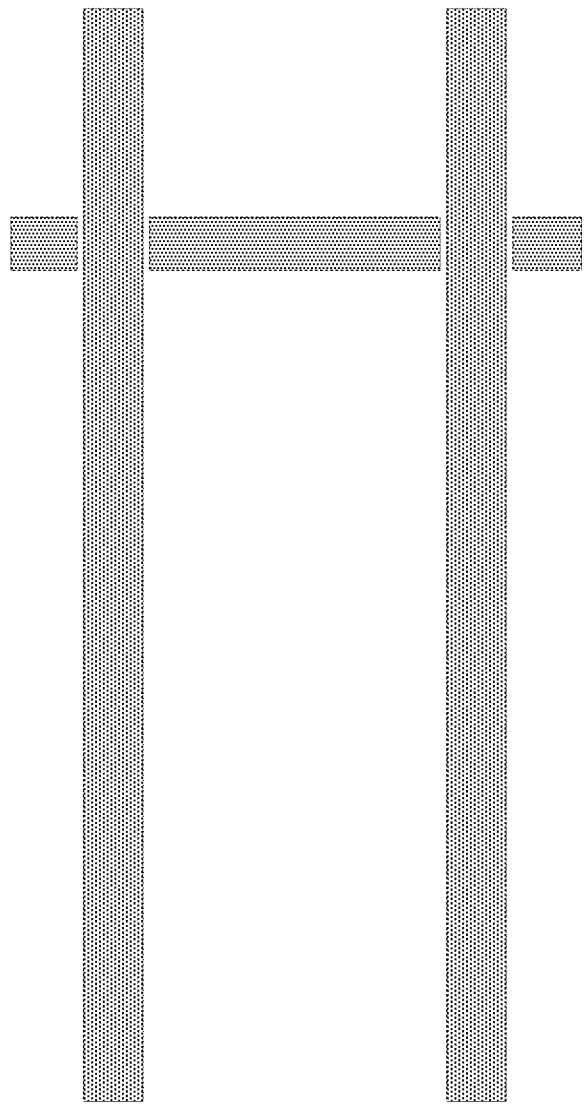
FIG. 17 is a schematic plan view of a fourth metal layer in the pixel area of FIG. 10.

FIG. 9 is a schematic diagram of a connection between a pixel circuit and the data line in the display panel according to an embodiment of the present disclosure, FIG. 10 is a schematic layout diagram of a pixel area where a pixel circuit 60 in FIG. 9 is located, FIG. 11 is a schematic diagram of a layout of data lines in a 2*2 pixel area, and FIG. 12 to FIG. 17 respectively show the schematic layout of several film layers in the pixel area in FIG. 10. In particular, FIG. 12 is a schematic plan view of an active layer in the pixel area of FIG. 10, FIG. 13 is a schematic plan view of a first metal layer in the pixel area of FIG. 10, FIG. 14 is a schematic plan view of a capacitive metal layer in the pixel area of FIG. 10, FIG. 15 is a schematic plan view of a second metal layer in the pixel area of FIG. 10, FIG. 16 is a schematic plan view of a third metal layer in the pixel area of FIG. 10, and FIG. 17 is a schematic plan view of a fourth metal layer in the pixel area of FIG. 10. Further, FIG. 18 is a circuit diagram of a pixel corresponding to the pixel area in FIG. 10, and FIG. 19 is a driving timing diagram corresponding to the pixel circuit in FIG. 18.

Referring to FIG. 9. In some embodiments, the display panel may include a plurality of pixel circuits 60 arranged in an array. Among the plurality of pixel circuits 60 located in the same column along the first direction D1, the pixel circuits 60 located in odd rows may share the same data line Data, and the pixel circuits 60 located in even rows may share another data line Data. The two data lines Data electrically connected to the pixel circuits 60 of odd rows and the pixel circuits 60 of even rows in the same column of pixel circuits 60 may be respectively distributed on opposite sides of the column of the pixel circuits 60 along the second direction D2.

Figure 18:
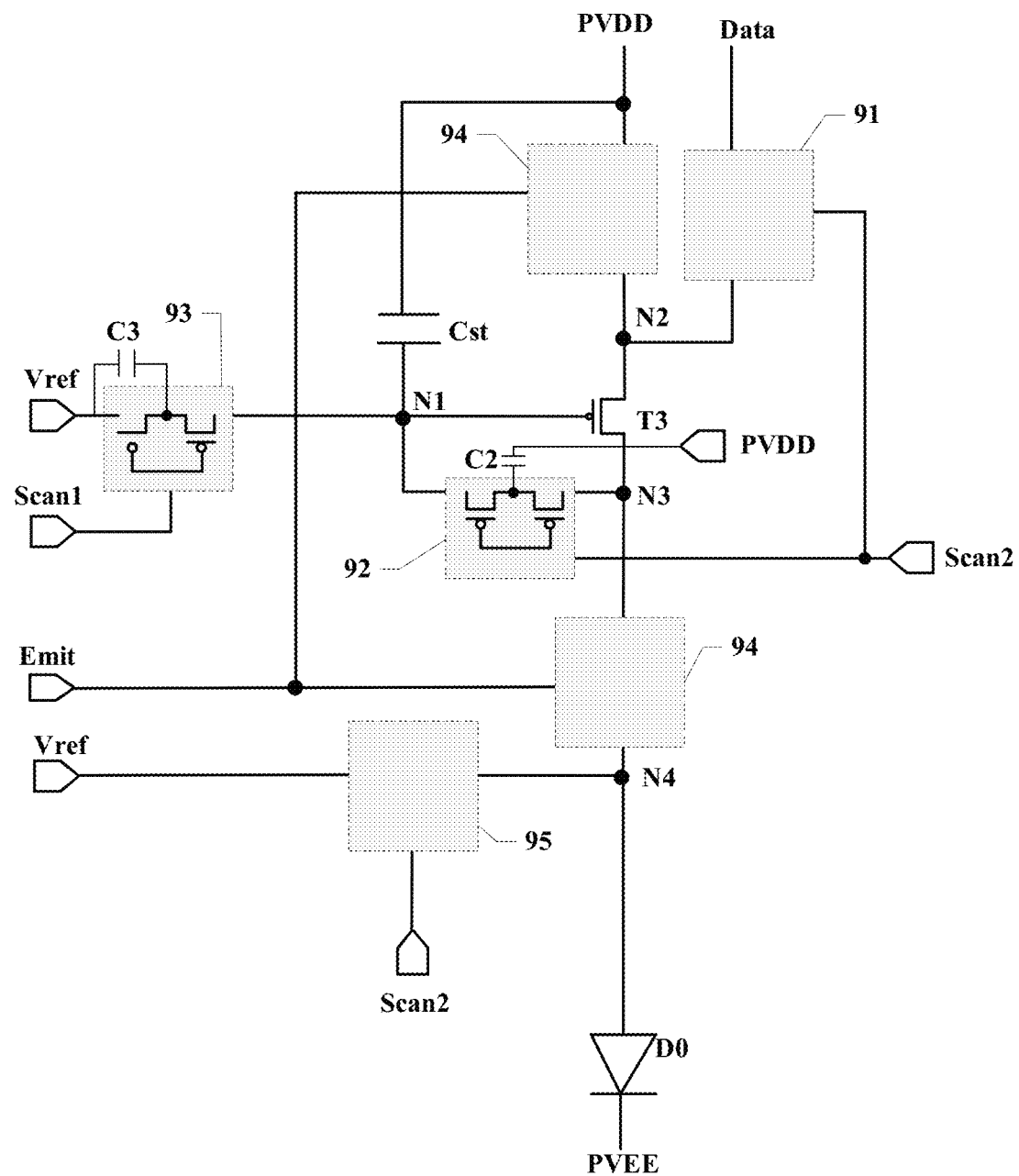
FIG. 18 is a circuit diagram of a pixel corresponding to the pixel area in FIG. 10.
Figure 19:
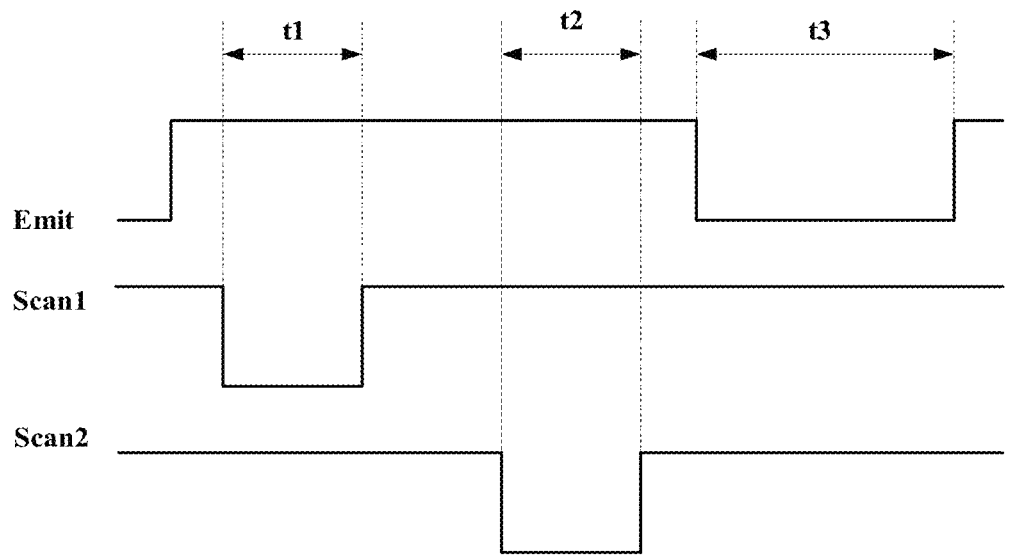
FIG. 19 is a driving timing diagram corresponding to the pixel circuit in FIG. 18.

Specifically, in the embodiment shown in FIG. 9, reference can be made to FIG. 10 for the layout of the area where each pixel circuit 60 is located, and reference can be made to FIG. 18 for the specific composition of each pixel circuit 60. Referring to FIG. 6 and FIG. 10 to FIG. 18, the display panel may include an active layer Poly, a first metal layer M1, a capacitor metal layer MC, a second metal layer M2, a third metal layer M3, and a fourth metal layer M4. In some embodiments, the pixel circuit 60 may include a plurality of transistors, the gates of the transistors may be located on the first metal layer M1, and the source electrodes S and the drain electrodes d may be located on the second metal layer M2. The scan lines Scan1 and Scan2 and the light-emitting control line Emit may be located on the first metal layer M1, the reset signal line Vref may be located on the capacitor metal layer MC, the power signal line PVDD may be located on the second metal layer M2, and the connecting line L0 may be located on the fourth metal layer M4. It should be noted that FIG. 10 to FIG. 17 only schematically show a film layer relationship in the area where the pixel circuit 60 is located, and do not specifically limit the film layers where different structures in the pixel circuit are located. In other implementations, the power signal line PVDD and the data lines Data may also be arranged on the same layer without short circuit, or the power signal line PVDD may be arranged on the side away from the data lines Data from the substrate 00.

It should be noted that FIG. 9 only illustrates the pixel circuit 60 in the display panel in the form of a rectangular box, and for the layout and circuit structure of the pixel circuit 60 reference can be made to FIG. 10 and FIG. 18 respectively. The pixel circuits in FIG. 10 and FIG. 18 are only schematic, and do not limit the structure of the pixel circuit in the present disclosure. In some other embodiments of the present disclosure, the pixel circuit may also be embodied in other feasible structures. In this embodiment, different filling patterns of the rectangular boxes represent pixel circuits corresponding to sub-pixels of different colors. The sub-pixels corresponding to the pixel circuits of the rectangular box with the same filling pattern may have the same luminous color, and the sub-pixels corresponding to the pixel circuits of the rectangular box with different filling patterns may have different luminous colors. The three different filling patterns of the rectangular boxes in the FIG. 9 indicate that the display panel includes three sub-pixels with different luminous colors. In some embodiments, the three luminous colors may be red, green, and blue respectively.

In some embodiments, the pixel circuit may include a driving transistor T3, a data writing module 91, a compensation module 92, a first reset module 93, a light-emitting control module 94, and a second reset module 95. The gate of the driving transistor T3 may be connected to a first node N1, the first electrode of the driving transistor T3 may be connected to a second node N2, and the second electrode of the driving transistor T3 may be connected to a third node N3. In some embodiments, the data writing module 91 may include a second transistor T2, the light-emitting control module 94 may include a first transistor T1 and a sixth transistor T6, the compensation module 92 may include a fourth transistor T4, the first reset module 93 may include a fifth transistor T5, and the second reset module 95 may include a seventh transistor T7. The electrodes of the sixth transistor T6 in the first reset module 93 may be respectively connected to the reset signal line Vref and the first node N1, and the gate of the sixth transistor T6 in the first reset module 93 may be connected to the first scan line Scan1. The electrodes of the second transistor T2 in the data writing module 91 may be respectively connected to the data line Data and the second node N2, and the gate of the second transistor T2 in the data writing module 91 and the gate of the seventh transistor T7 in the second reset module 95 may be connected to the second scan line Scan2. The electrodes of the first transistor T1 in the light-emitting control module 94 may be respectively connected to the power signal line PVDD and the second node N2, and the gate of the first transistor T1 may be connected to the light-emitting control line Emit. The electrodes of the seventh transistor T7 in the second reset module 95 may be respectively connected to the reset signal line Vref and a fourth node N4, and the fourth node N4 may be connected to the anode of a light-emitting element D0. It should be noted that the driving circuit of this embodiment is being described by taking each transistor as a P-type transistor as an example, but the type of the transistors is not limited in the embodiments of the present disclosure.

Referring to FIG. 18 and FIG. 19. Within the duration of one frame, the display panel may perform the a first reset stage t1, a data writing stage t2, and a light-emitting stage t3. In the first reset stage t1, the first scan line Scan1 may be configured to provide a low-level signal to the fifth transistor T5 to turn on the fifth transistor T5, and a reset signal may be sent to the driving transistor T3 for resetting the gate of the driving transistor T3. In the data writing stage t2, the second scan line Scan2 may be configured to provide a low-level signal to the second transistor T2, the fourth transistor T4, and the seventh transistor T7 to turn on the transistor T2, the fourth transistor T4, and the seventh transistor T7, the data signal may be written to the gate of the driving transistor T3 (or it can be referred to as the threshold grabbing of the driving transistor T3), and the reset signal may be sent to the fourth node N4 to reset the anode of the light-emitting element D0. In the light-emitting stage t3, the light-emitting control line Emit may be configured to provide a low-level signal to the first transistor T1 and the sixth transistor T6 to turn on the first transistor T1 and the sixth transistor T6, the signal on the power signal line PVDD may be sent to the driving transistor T3, and the light-emitting element D0 may respond to the driving signal of the driving transistor T3 to emit light.

Figure 20:
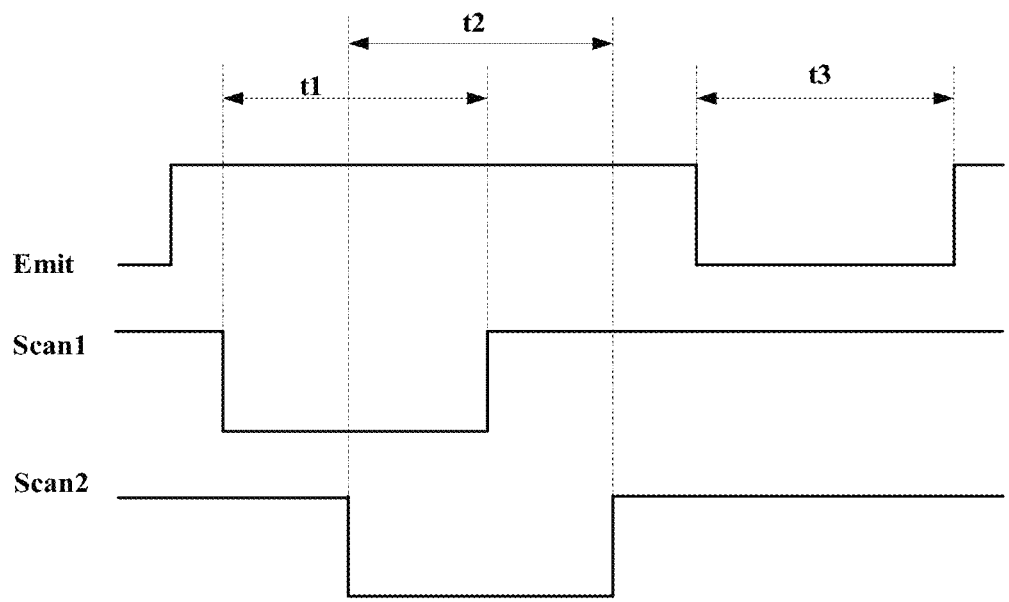
FIG. 20 is another driving timing diagram corresponding to the pixel circuit in FIG. 18.

In this embodiment, since each column of pixel circuits 60 is correspondingly provided with two data lines Data, and two adjacent pixel circuits 60 in the same column are connected to different data lines Data, therefore, data writing in two adjacent rows of pixel circuits 60 does not affect each other. FIG. 20 is another driving timing diagram corresponding to the pixel circuit in FIG. 18. Referring to FIG. 18 and FIG. 20. When the effective level signal is sent to the first scan line Scan1, the pixel circuit of the previous row may enter the data writing stage, and the pixel circuit of the current row may enter the reset stage. When the effective level signal is sent to the second scan line Scan2, the pixel circuit of the current row may enter the data writing stage. In this embodiment, there is an overlap in the transmission time of the effective level signals on the first scan line Scan1 and the second scan line Scan2. That is, there is an overlap between the data writing stage of the pixels in the previous row and the pixels in the current row. Since two adjacent pixel circuits 60 in the same column are connected to different data lines Data, the pixel circuits 60 in two adjacent rows can write data through different data line Data with affecting each other. In this way, at the stage of writing data to the sub-pixel circuit 60 of the $x^{th}$ row, the data writing to the sub-pixel circuit 60 of the $x-1^{th}$ row can be continued, and the writing time of the data signal can be extended. Since the data writing process is also a process of compensating the threshold value of the driving transistor, extending the writing time of the data signal also extends the time for threshold compensation of the driving transistor, which is beneficial to improving the low-gray-scale visual effect and afterimage caused by the threshold shift of the driving transistor, thereby improving the display effect.

The fourth transistor T4 and the fifth transistor T5 in the embodiment shown in FIG. 18 are described by taking a transistor with a double-gate structure as an example. The double-gate structure is beneficial to reducing the leakage current of the fourth transistor T4 and the fifth transistor T5 to the first node N1, thereby maintaining the stability of the gate potential of the driving transistor T3. In addition, in the embodiment shown in FIG. 18, the control terminal of the seventh transistor T7 is connected to the second scan line Scan2 as an example for illustration, but the present disclosure is not limited thereto.

It should be noted that FIG. 18 only shows the storage capacitor Cst. In fact, referring to FIG. 12 to FIG. 14, the storage capacitor Cst may include two capacitors connected in parallel, namely a capacitor Cst1 and a capacitor Cst2. The capacitor Cst1 may be composed of a plate Cst1-1 located on the first metal layer M1 and a plate Cst1-2 located on the capacitor metal layer MC (configured to receive the voltage of the power signal line PVDD), and the capacitor Cst2 may be composed of a plate Cst2-1 located on the semiconductor layer poly and a plate Cst2-2 located on the capacitor metal layer MC (configured to receive the voltage of the power signal line PVDD). The storage capacitor can be formed by connecting two capacitors in parallel, which is beneficial to increasing the capacity that the storage capacitor can store.

Referring to FIG. 12 to FIG. 14 and FIG. 18. In some embodiments, the pixel circuit may further include a second capacitor C2 and a third capacitor C3. The second capacitor C2 may be composed of a plate C2-1 on the semiconductor layer poly and a plate C2-2 located on the capacitor metal layer MC (configured to receive the voltage of the power signal line PVDD). When the level of the second scan line Scan2 changes, the charge of the node connected to the fourth transistor T4 and the second capacitor C2 may be stored in the second capacitor C2 to prevent the charge of this node from being injected into the first node N1, which is beneficial to maintaining the stability of the gate potential of the driving transistor T3, thereby stabilizing the driving current generated by the driving transistor T3, thereby improving the display uniformity of the display panel.

The third capacitor C3 may be composed of a plate C3-1 located on the semiconductor layer poly and a plate C3-2 located on the capacitor metal layer MC (configured to receive the voltage of the reset signal line Vref). When the level of the first scan line Scan1 changes, the charge of the node connected to the fifth transistor T5 and the third capacitor C3 may be stored in the third capacitor C3 to prevent the charge of this node from being injected into the first node N1, which is also beneficial to maintaining the stability of the gate potential of the driving transistor T3, thereby stabilizing the driving current generated by the driving transistor T3, thereby improving the display uniformity of the display panel.

Figure 21:
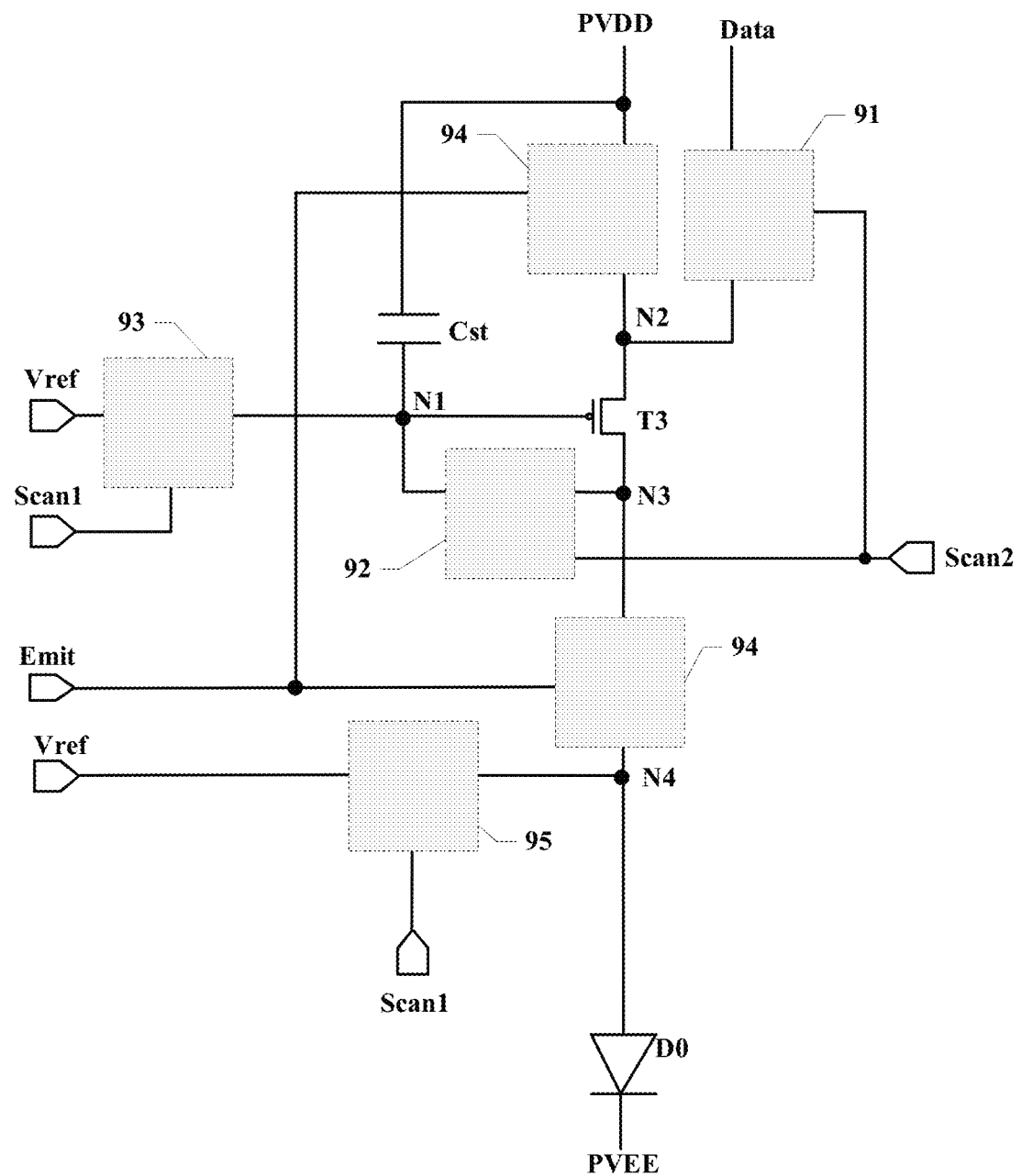
FIG. 21 is another schematic structural diagram of the pixel circuit according to an embodiment of the present disclosure.

It should be noted that the structure of the pixel circuit in FIG. 18 is only for illustration, and the present disclosure does not specifically limit the structure of the pixel circuit. In some other embodiments of the present disclosure, the pixel circuit may also adopt other feasible structures, such as the structure shown in FIG. 21. FIG. 21 is another schematic structural diagram of the pixel circuit according to an embodiment of the present disclosure. The differences between FIG. 21 and FIG. 18 are as follows: the fourth transistor T4 and the fifth transistor T5 are transistors with a single-gate structure, and the seventh transistor T7 is connected to the first scan line Scan1.

Referring to FIG. 9. When the two data lines Data introduced into the display panel for each column of pixel circuits 60, the number of data lines Data actually included in the display panel can be increased. If the data lines Data in the first display area AA1 and the second display area AA2 are directly electrically connected to the fan-out lines S0 in the first fan-out area A1, the width of the fan-out lines in the first fan-out area A1 along the second direction D2 will be increased, which increases the width of the first fan-out area A1 along the d1, which is not beneficial to the narrowing of the frame of the display panel. Therefore, the embodiments of the present disclosure introduce a connecting line L0 for the data lines Data in the second display area AA2, and electrically connect the connecting line L0 with the fan-out lines S0 in the first fan-out area A1 to reduce the frame width occupied by the fan-out lines S0 in the first fan-out area A1, thereby realizing the narrow frame design of the display panel.

Figure 22:
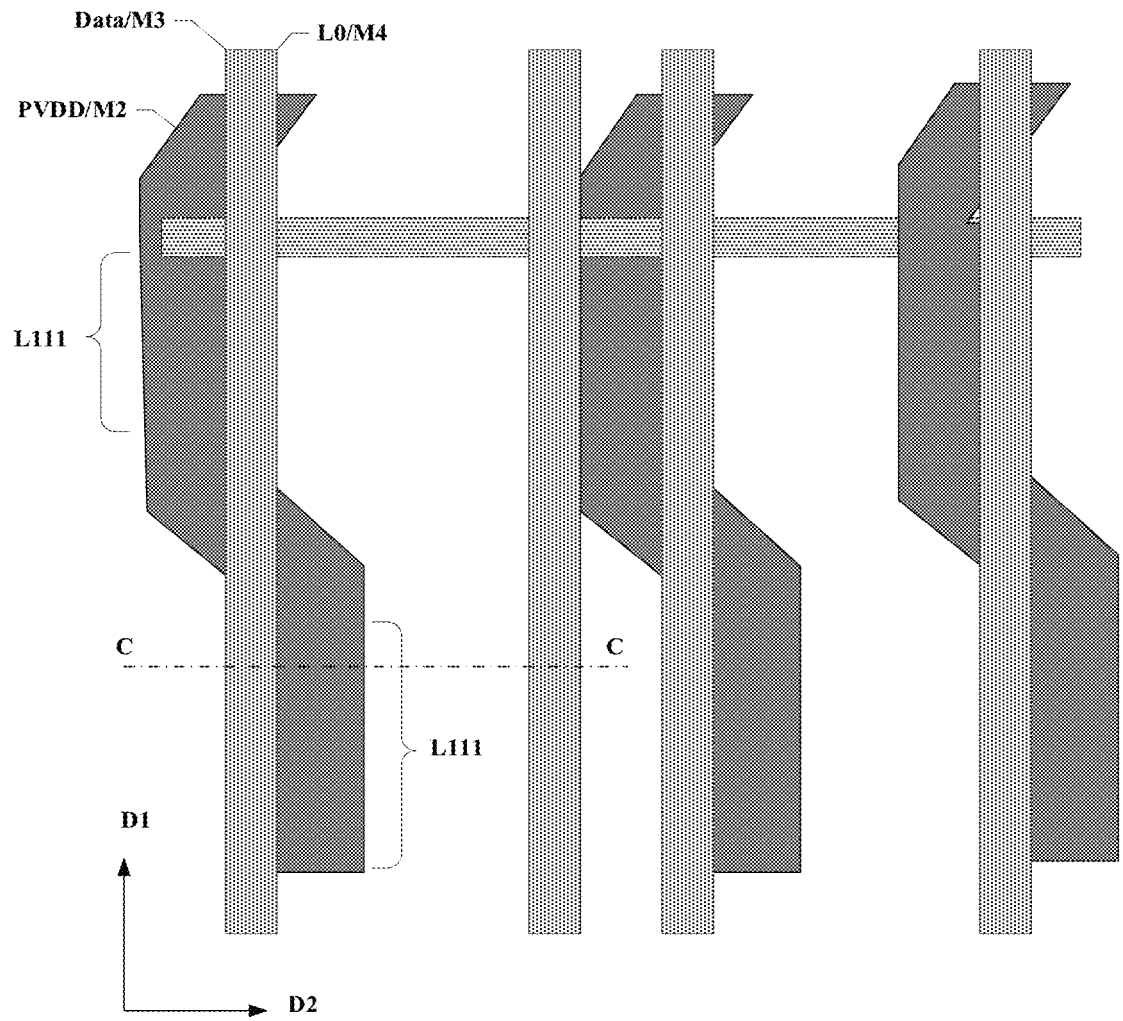
FIG. 22 is a relative positional relationship diagram of a power signal line, the data line, and the connecting line in the present disclosure.
Figure 23:
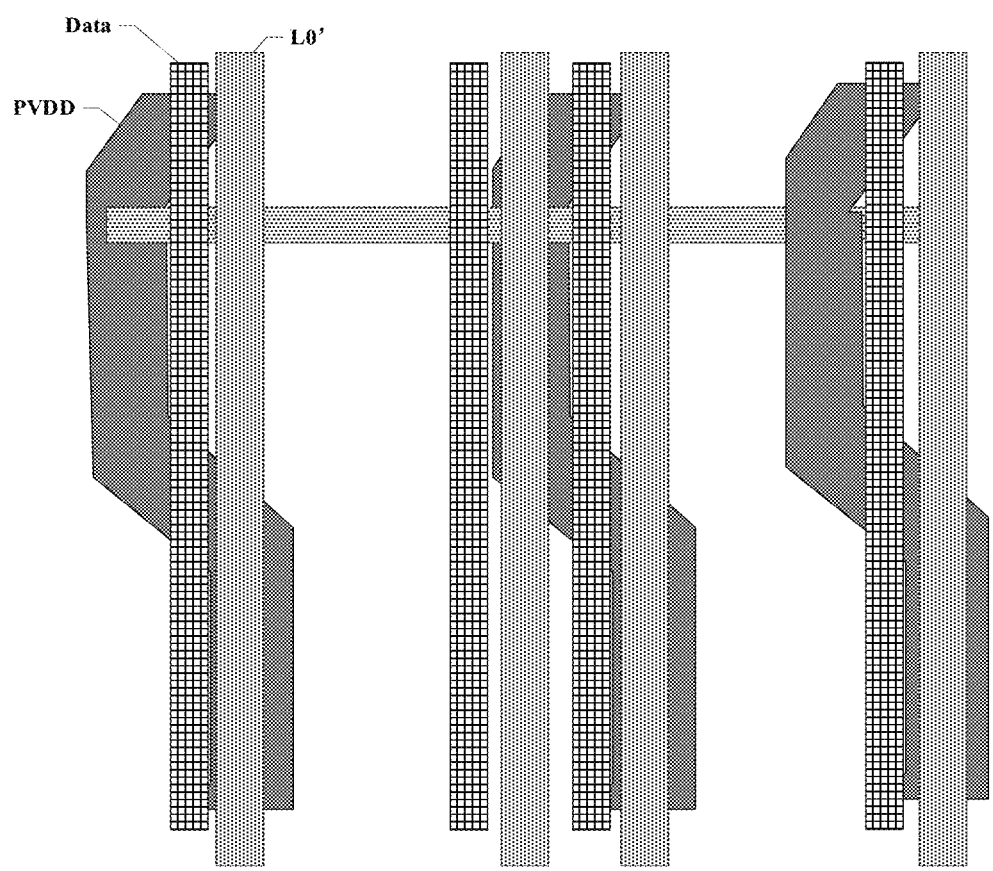
FIG. 23 is a relative positional relationship diagram of the power signal line, the data line, and the connecting line in the related art.

FIG. 22 is a relative positional relationship diagram of a power signal line, the data line, and the connecting line in the present disclosure, and FIG. 23 is a relative positional relationship diagram of the power signal line, the data line, and the connecting line in the related art. FIG. 22 and FIG. 23 respectively illustrate the power signal lines, data lines, and connecting lines in the area where two adjacent pixel circuits are located. Referring to FIG. 23. In the related art, in order to avoid the loss of aperture ratio caused by the introduction of the connecting line L0', the connecting line L0' is generally arranged above or below the power signal line PVDD' in the display panel and overlaps with the power signal line. However, when the connecting line L0 is arranged to have a relatively large overlapping area with the power signal line, the signal on the power signal line has a greater impact on the signal stability of the connecting line L0, and there is a large crosstalk problem. For this reason, in the embodiments of the present disclosure, the first connecting line segment L1 extending along the first direction D1 in the connecting line L0 can be arranged to at least partially overlap with the data lines Data in the first display area AA1 along the thickness direction of the display panel such as shown in FIG. 22. In this way, the overlapping area between the connecting line L0 and the power signal line can be reduced, thereby reducing the possibility of crosstalk.

Figure 24:
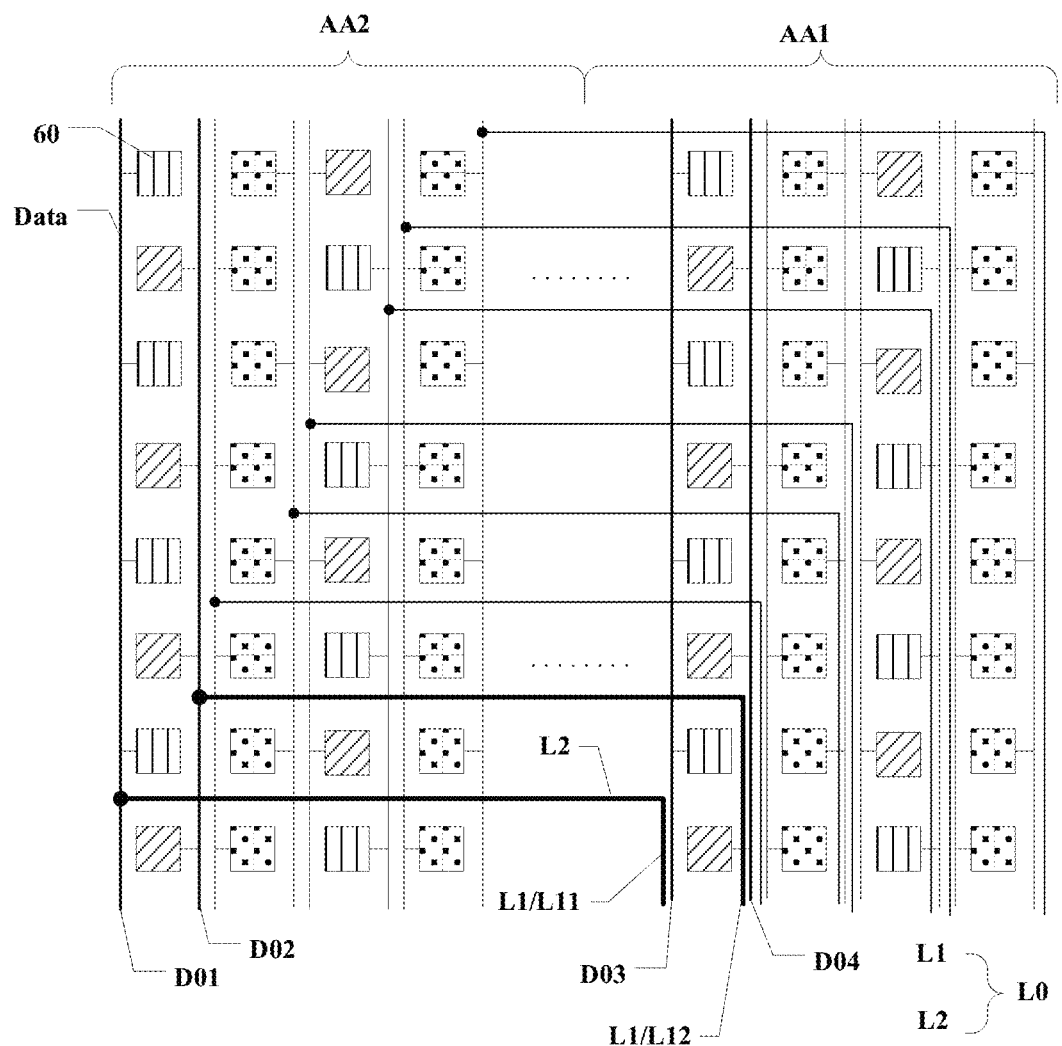
FIG. 24 is a schematic wiring diagram of the data line and the connecting line in a first display area and a second display area.

FIG. 24 is a schematic wiring diagram of the data line and the connecting line in a first display area and a second display area. Referring to FIG. 24. In some embodiments, along the thickness direction of the display panel, the two first connecting line segments L1 connected to the two data lines Data connected to the same row of pixel circuits 60 in the second display area AA2 may overlap with the two adjacent data lines Data in the first display area AA1 respectively. For the overlapping arrangement of the data lines Data and the first connecting line segments L1, reference can be made to FIG. 10.

For the embodiment in which two data lines Data are introduced for each column of pixel circuits 60 in the display panel, when the data line Data in the second display area AA2 is connected to the first fan-out area A1 below the first display area AA1 through the connecting line L0, the first connecting line segment L1 of the two connecting lines L0 corresponding to the same column of pixel circuits 60 in the second display area AA2 may overlap with the two adjacent data lines Data in the first display area AA1 respectively. Referring to FIG. 24, assume that in the second display area AA2, the data lines Data corresponding to the same pixel column include the data line D01 on the left side of the pixel column and the data line D02 on the right side of the pixel column, in the first display area, the data lines Data corresponding to the same pixel column may include the data line D03 on the left side of the pixel column and the data line D04 on the right side of the pixel column. The first connecting line segments in the connecting lines connected to the data line D01 and the data line D02 may respectively be the first connecting line segment L11 and the first connecting line segment L12. In the first display area AA1, the first connecting line segment L11 may overlap the data line D03 on the left side of the pixel column, and the first connecting line segment L1 may overlap the data line D04 on the right side of the pixel column. In this way, it is beneficial to simplify the wiring structure of the connecting lines L0 and avoid the possibility of overlapping the connecting lines L0.

Figure 25:
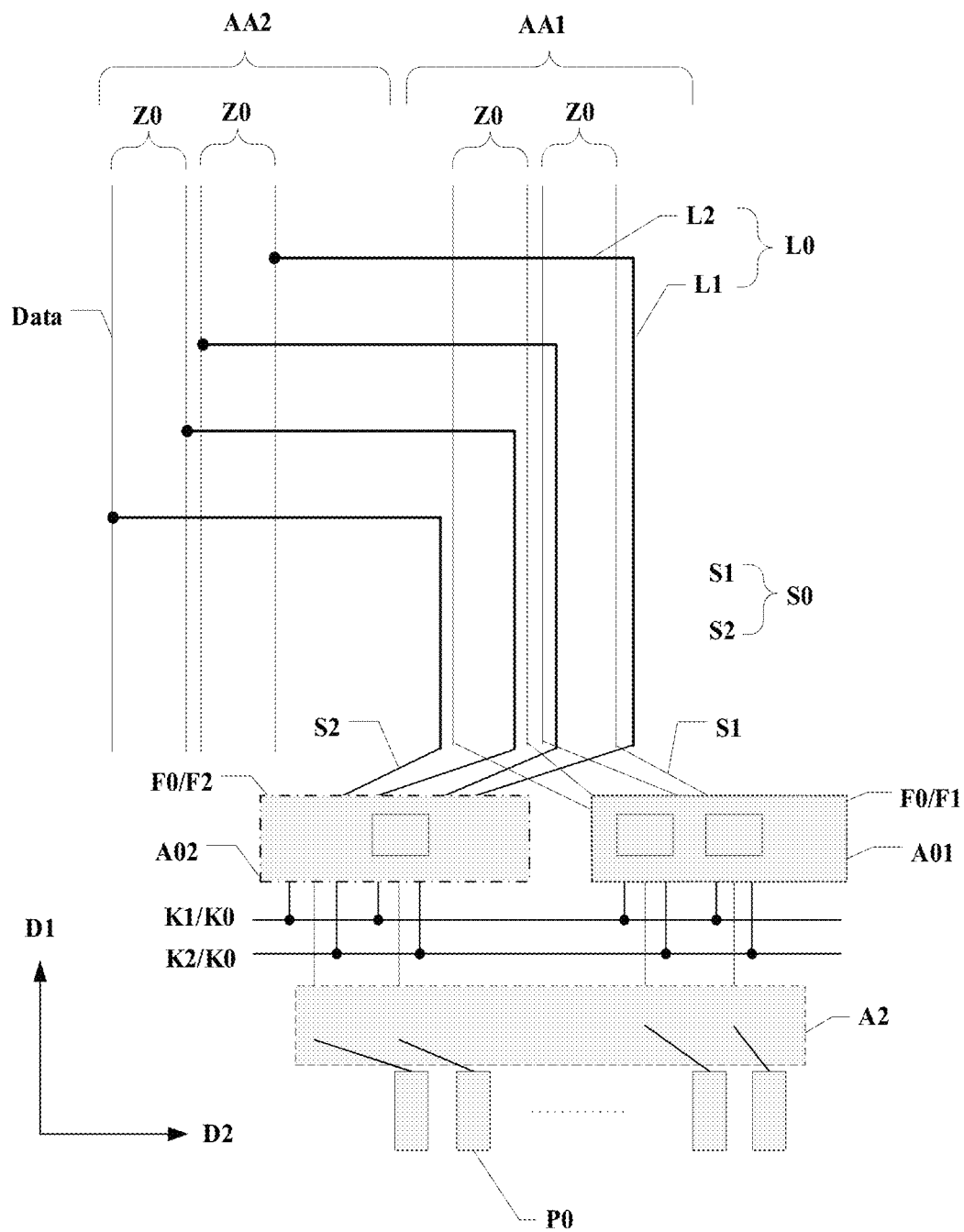
FIG. 25 is a relative positional relationship diagram of the connecting line, the data line, and the demultiplexing unit.

FIG. 25 is a relative positional relationship diagram of the connecting line, the data line, and the demultiplexing unit. Referring to FIG. 9 and FIG. 25. In some embodiments, the demultiplexing unit F0 may include a plurality of first demultiplexing units F1 and a plurality of second demultiplexing units F2. The output terminal of the switching element T in the first demultiplexing unit F1 may be electrically connected to the data line Data in the first display area AA1 through the fan-out line (e.g., the first fan-out line S1), and the output terminal of the switching element T in the second demultiplexing unit F2 may be electrically connected to the first connecting line segment L1 corresponding to the data line Data in the second display area AA2 through the fan-out line S0 (e.g., the second fan-out line S2). The display panel may further include a demultiplexing unit setting area. The demultiplexing unit setting area may include a first setting area A01 and a second setting area A02, and the second setting area A02 may be located on at least one side of the first setting area A01 along the second direction D2. In some embodiments, the first demultiplexing unit F1 may be located in the first setting area A01, and the second demultiplexing unit F2 may be located in the second setting area A02.

More specifically, in the embodiments of the present disclosure, the demultiplexing unit setting areas A01 and A02 may be arranged in the non-display area NA of the display panel. The demultiplexing unit setting areas A01 and A02 may be arranged on the side of the first fan-out area A1 away from the display area AA, and the demultiplexing unit setting areas may include the first setting area A01 and the second setting area A02 located on at least one side of the first setting area A01 along the first direction D1. The embodiment in FIG. 9 and FIG. 25 only takes the technical solution of arranging the second setting area A02 of the left side of the first setting area A01 as an example for illustration. If the second setting area A02 is arranged on the right side of the first setting area A01, the second setting area A02 can be regarded as a mirror image arrangement of the technical solution shown in FIG. 9 and FIG. 25. The data line Data in the first display area AA1 may be electrically connected to the first demultiplexing unit F1 through the first fan-out line S1, and the data line Data in the second display area AA2 may be electrically connected to the second demultiplexing unit F2 through the connecting line L0 and the second fan-out line S2. In addition, the first demultiplexing unit F1 may be located in the first setting area A01, and the second demultiplexing unit F2 may be located in the second setting area A02. The data line Data in the second display area AA2 may be located on the left side of the data line Data in the first display area AA1 along the first direction D1, and the second demultiplexing unit F2 connected to the data line Data in the second display area AA2 may also be located on the left of the first demultiplexing unit F1 connected to the data line Data in the first display area AA1 along the first direction D1. In this way, even after the data line Data in the first display area AA1 is connected to the fan-out line S0 and the second demultiplexing unit F2 through the connecting line L0, the layout of the demultiplexing unit F0 originally connected to the data line Data in the first display area AA1 will not be affected. Therefore, while realizing the narrow frame design of the display panel and avoiding signal crosstalk, the layout of the demultiplexing unit F0 in the display panel can also be simplified.

It should be noted that FIG. 9 and FIG. 25 only illustrate the demultiplexing units F0 in the first setting area A01 and the second setting area A02, and the switching elements T in each demultiplexing unit F0 are distributed in the same row. In some other embodiments of the present disclosure, the switching elements T in the demultiplexing unit F0 may also be arranged in two or more rows based on the actual number and the size of the non-display area NA, which is not limited in the embodiments of the present disclosure.

Referring to FIG. 9 and FIG. 25. In some embodiments, the input terminals of the switching elements T in different demultiplexing units F0 may be respectively, electrically connected different conductive pads P0. In addition, along the second direction D2, the arrangement order to the data line group Z0 may be the same as the arrangement order of the conductive pads corresponding to the demultiplexing units F0.

In the embodiments of the present disclosure, a bonding area may be arranged on the side of the demultiplexing unit F0 away from the display area AA, and the conductive pad P0 may be arranged in the bonding area. The conductive pad P0 may be used for electrical connection with the control chip. The control chip may pass through the conductive pad P0, the demultiplexing unit F0 electrically connected to the conductive pad P0, and the fan-out line S0 in the first fan-out area A1 connected to the switching element T in the demultiplexing unit F0, to send the data signal to the corresponding data line Data. The number of data lines Data included in each data line group Z0 may be X, and X≥2. The data line group Z0 may be arranged in one-to-one correspondence with the demultiplexing unit F0, and each data line group Z0 may be electrically connected to a conductive pad P0 through a demultiplexing unit F0. Assume that the display panel includes M data line groups Z0 arranged in sequence along the second direction D2, along the second direction D2, the arrangement order of the data line group Z0 may be the same as the arrangement order of the conductive pads corresponding to the demultiplexing units F0. That is, the $i^{th}$ data line group Z0 may be electrically connected to the $i^{th}$ conductive pad P0 in the bonding area through the demultiplexing unit F0, where 1≤i≤M. In this way, even if the data line Data in the second display area AA2 is connected to the demultiplexing unit F0 through the connecting line L0 and the fan-out line S0 below the first display area AA1, and is further electrically connected to the conductive pad P0, there is no need to change the original arrangement order of the conductive pads P0 in the bonding area. Since the conductive pads P0 are generally electrically connected to the control chip, when the arrangement order of the conductive pads P0 does not change, there is no need to change the structure of the control chip and its existing algorithms, which is beneficial to simplify the overall manufacturing process of the display product without increasing the process cost.

In some embodiments, when the demultiplexing units F0 are arranged in a row along the second direction D2, the arrangement order of the demultiplexing units F0 may also be the same as the arrangement order of the data line groups Z0. For example, the switching element T in the $i^{th}$ demultiplexing unit F0 arranged along the second direction D2 may be electrically connected to the data line Data in the $i^{th}$ data line group Z0 arranged along the second direction D2, where $1 \leq i \leq M$. In this way, when the data line Data in the second display area AA2 is connected to the first fan-out area A1 below the first display area AA1 through the connecting line L0, the data line Data in the corresponding data line group Z0 can be electrically connected to the demultiplexing unit F0 through the fan-out line S0 in the first fan-out area A1 without changing the original order of the demultiplexing units F0, which is beneficial to simplifying the manufacturing process of the display panel without increasing the process cost.

Referring to FIG. 9 and FIG. 25. In some embodiments, the fan-out line S0 connected to the output terminal of the switching element T in the first demultiplexing unit F1 may be the first fan-out line S1, the fan-out line S0 connected to the output terminal of the switching element T in the second demultiplexing unit F2 may be the second fan-out line S2, and at least one second demultiplexing unit F2 and at least one first fan-out line S1 may be arranged in different layers.

Figure 26:
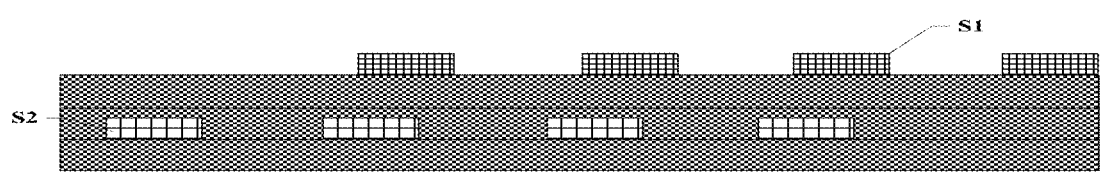
FIG. 26 is a schematic diagram of a film layer of a first fan-out area in the display panel according to an embodiment of the present disclosure.

In the embodiments of the present disclosure, the data line Data located in the second display area AA2 may be electrically connected to the second fan-out line S2 in the first fan-out area A1 through the connecting line L0, and the second fan-out line S2 may be further electrically connected to the second demultiplexing unit F2 in the second setting area A02. The data line Data located in the first display area AA1 may be electrically connected to the first fan-out line S1 in the first fan-out area A1, and the second fan-out line S2 may be further electrically connected to the first demultiplexing unit F1 in the first setting area A01. In the embodiments of the present disclosure when laying out the first fan-out line S1 and the second fan-out line S2, the first fan-out line S1 and the second fan-out line S2 may be arranged on different film layers. For example, when only one or several second fan-out lines S2 have the risk of short-circuiting with the first fan-out line S1 (e.g., when the first fan-out line and the second fan-out line are arranged on the same layer, due to the limited layout space, the line spacing is reduced, and short circuits are prone to occur between adjacent lines), or when arranging the first fan-out lines and the second fan-out lines on the same layer will take up a lot of space and is not beneficial to realizing the narrow frame design, these second fan-out lines S2 may be arranged on different sides of the first fan-out lines S1 film layer. Of course, in some other embodiments of the present disclosure, all the second fan-out lines S2 may also be arranged on one film layer, and all the first fan-out lines S1 may be arranged on another film layer. Referring to FIG. 12, the wiring of the second fan-out lines S2 and the wiring of the first fan-out lines S1 do not interfere with each other, which not only avoids the short circuit between the first fan-out lines S1 and the second fan-out lines S2, but also simplifies the wiring of the fan-out lines S0. FIG. 26 is a schematic diagram of the film layer of the first fan-out area A1 in the display panel according to an embodiment of the present disclosure. It should be noted that FIG. 26 only schematically illustrates part of the first fan-out lines S1 and part of the second fan-out lines S2 in the first fan-out area A1, and does not represent the actual number of the first fan-out lines S1 and the second fan-out lines S2 actually included in the display panel. In addition, FIG. 26 also illustrates the technical solution of distributing the first fan-out lines S1 and the second fan-out lines S2 in two different film layers. In some other embodiments of the present disclosure, considering that the number of the first fan-out lines S1 and the second fan-out lines S2 may be relatively large, in order to reduce the space occupied by the fan-out lines S0 in the first fan-out area A1, the first fan-out lines S1 may also be distributed in two or more film layers, which is not limited in the embodiments of the present disclosure. In some embodiments, the film layer where first fan-out lines S1 and the second fan-out lines S2 are located may be selected from the first metal layer M1, the capacitor metal layer MC, the second metal layer M2, the third metal layer M3, and the fourth metal layer M4 in the embodiment shown in FIG. 6, and there is no need to introduce a new film layer structure in the display panel, which simplifies the overall film layer structure of the display panel. For the specific embodiments of the film layers that can be provided in the display panel for the first fan-out lines S1 and the second fan-out lines S2, reference can be made to the description in the subsequent embodiments.

Referring to FIG. 25 and FIG. 26. In some embodiments, at least one first fan-out line S1 may be arranged in the same layer as the data lines Data line Data connected thereto, and at least one second fan-out line S2 may be arranged on the same layer as the first connecting line segment L1 connected thereto.

More specifically, when the data line Data in the first display area AA1 is electrically connected to the first fan-out line S1, and then connected to the demultiplexing unit F0, at least one first fan-out line S1 and the data line Data connected to it may be arranged on the same layer. This part of the first fan-out line S1 and the data line Data connected to it may be manufactured in the same manufacturing process, and there is no need to form a connection through punching, which is beneficial to simplifying the connection between the first fan-out line S1 and the data line Data in this part, which simplifies the manufacturing process. Considering that the number of the first fan-out lines S1 may be relatively large, in order to avoid the width of the border where the fan-out area is located from being too wide due to the connection of the first fan-out line S1 on the same film layer, in some other embodiments of the present disclosure, the first fan-out lines S1 may be distributed in two or more film layers. At this time, one of the multiple film layers distributed with the first fan-out lines S1 may be arranged on the same layer as the data line Data, and the other film layers may be arranged on different layers from the data line Data. In this way, the narrow frame design of the display panel can be realized, and the manufacturing process can be simplified.

Similarly, when at least one second fan-out line S2 and the first connecting line segment L1 connected to it are arranged on the same layer, this part of the second fan-out line S2 and the first connecting line segment L1 connected to it may be manufactured in the same manufacturing process, and there is no need to form a connection through punching, which is beneficial to simplifying the connection between the second fan-out line S2 and the data line Data in this part, which simplifies the manufacturing process. In the embodiments of the present disclosure, the first connecting line segment L1 and the data line Data may be arranged in different layers. Referring to FIG. 6 and FIG. 10. The first connecting line segment L1 may be located at the fourth metal layer M4, and the data line Data may be located at the third metal layer M3. If the wiring space of the film layer where the first connecting line segment L1 is located is sufficient, multiple second fan-out lines S2 connected to the first connecting line segment L1 may be arranged on the same layer as the first connecting line segment L1. If the wiring space of the film layer where the first connecting line segment L1 is located is limited, or if the number of second fan-out lines S2 is relatively large and when the second fan-out lines S2 arranged on the same film layer affects the narrow frame design of the display panel, the first fan-out line S1 connected to the first connecting line may also be arranged on two or more film layers. At this time, one of the multiple film layers distributed with the second fan-out lines S2 may be arranged on the same layer as the first connecting line segment L1, and other film layers may be arranged on different layers from the first connecting line segment L1. In some embodiments, other film layers may be overlapped with at least one of the multiple film layers provided with the first fan-out lines S1, thereby realizing the reuse of film layers and simplifying the film layer structure of the display panel. In this way, the narrow frame design of the display panel can be realized, and the manufacturing process can be simplified.

Figure 27:
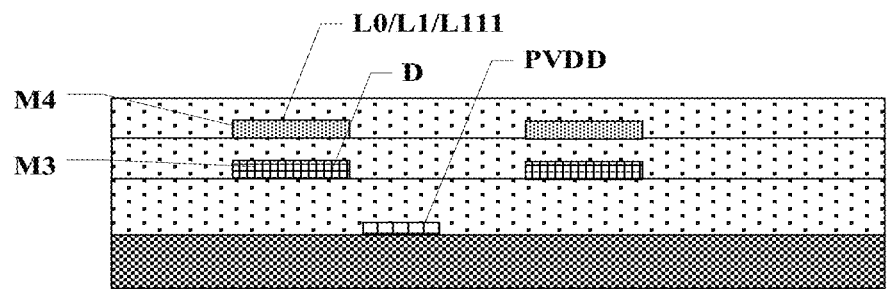
FIG. 27 is a schematic diagram of a film layer where the wiring in FIG. 22 is along a direction C-C.

FIG. 27 is a schematic diagram of a film layer where the wiring in FIG. 22 is along a direction C-C. Referring to FIG. 22 and FIG. 27. In some embodiments, the display panel may further include a power signal line PVDD disposed in the display area AA, and the power signal line PVDD may at least include a line segment L111 extending along the first direction D1. In addition, along the thickness direction of the display panel, the first connecting line segment L1 may not at least partially overlap with the line segment L111 of the power signal line PVDD extending along the first direction D1.

In the related art (referring to FIG. 23), in order to avoid the loss of aperture ratio caused by the introduction of the connecting line L0 in the display panel, the connecting line L0 may be arranged above or below the power signal line PVDD in the display panel and may have a relatively large overlapping area with the power signal line PVDD. However, when the connecting line L0' is arranged to overlap the power signal line PVDD, the signal on the power signal line has a great influence on the signal stability of the connecting line L0, and there is a large crosstalk. For this reason (referring to FIG. 22 and FIG. 27), in the embodiments of the present disclosure, when introducing the connecting line L0, the connecting line L0 may not overlap with the power signal line PVDD as much as possible, or the overlapping area of the connecting line L0 and the power signal line PVDD may be reduced as much as possible. For example, in some embodiments, the first connecting line segment L1 and the line segment of the power signal line extending along the first direction D1 may be arranged to at least not partially overlap along the thickness direction of the display panel, thereby reducing the overlapping area between the first connecting line segment L1 and the power signal line, and reducing the crosstalk between the first connecting line segment L1 and the power signal line. It should be noted that the part of the first connecting line segment L1 that does not overlap with the power signal line PVDD may overlap with the data line Data in the first display area AA1, and the overlapping first connecting line segment L1 and the data line Data may be configured to transmit data signals at the same time, thereby avoid or reduce the possibility of crosstalk. In addition, the overlapping arrangement of the first connecting line segment L1 and the data line Data can also be beneficial to reducing the influence of the introduction of the connecting line L0 on the aperture ratio of the display panel.

Referring to FIG. 22. In an actual layout, the power signal line PVDD may not extend strictly along the first direction or the second direction, and there may be a line segment extending along a direction intersecting both the first direction and the second direction. This line segment may overlap with the first connecting line segment L1. In actual production, signal crosstalk can be reduced by minimizing the overlapping area of the power signal line PVDD and the first connecting line segment L1.

Figure 28:
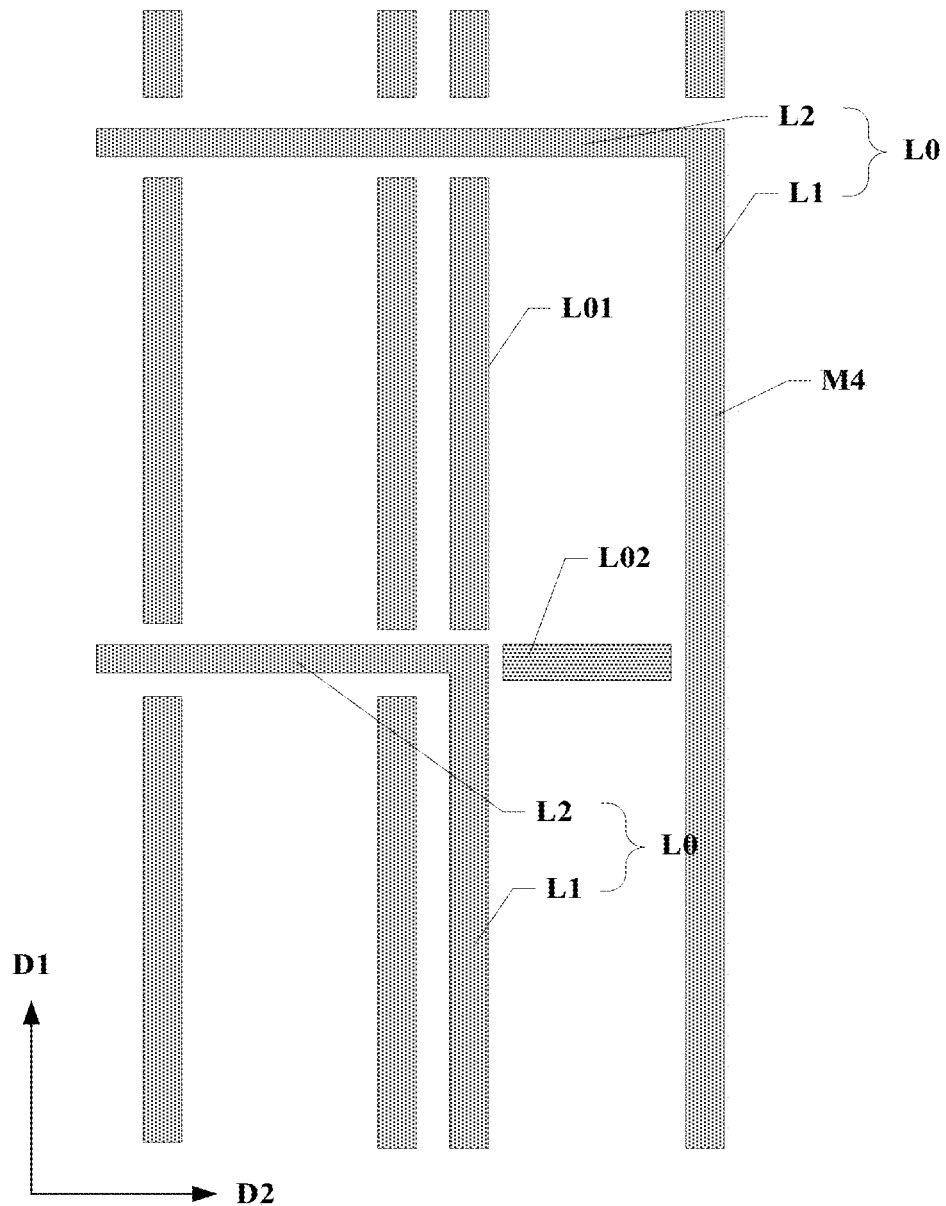
FIG. 28 is a schematic diagram of a partial layout of the film layer where the connecting line is located.

FIG. 28 is a schematic diagram of a partial layout of the film layer where the connecting line L0 is located, and FIG. 28 corresponds to the area where 2*2 pixel circuits are located. Referring to FIG. 24, FIG. 6, and FIG. 28. In some embodiments, the first connecting line segment L1 and the second connecting line segment L2 in each connecting line L0 may be arranged on the same layer.

When the first connecting line segment L1 and the second connecting line segment L2 in the connecting line L0 are arranged on the same film layer, there is no need to introduce more film layers to arrange the first connecting line segment L1 and the second connecting line segment L2 in the connecting line L0, thus facilitating the simplification of the film layer structure of the display panel. In some embodiments, both the first connecting line segment L1 and the second connecting line segment L2 may be disposed on the fourth metal layer M4. Considering that corresponding signal lines may be evenly distributed in other metal layers, for example, the scan line may be arranged on the first metal layer M1, the reset signal line Vref1 may be arranged on the capacitor metal layer MC, the power signal line PVDD may be arranged on the second metal layer M2, and the data line Data may be arranged on the third metal layer M3, therefore, when the first connecting line segment L1 and the second connecting line segment L2 are arranged on the fourth metal layer M4, the fourth metal layer M4 will have enough space for the first connecting line segment L1 and the second connecting line segment L2.

Figure 29:
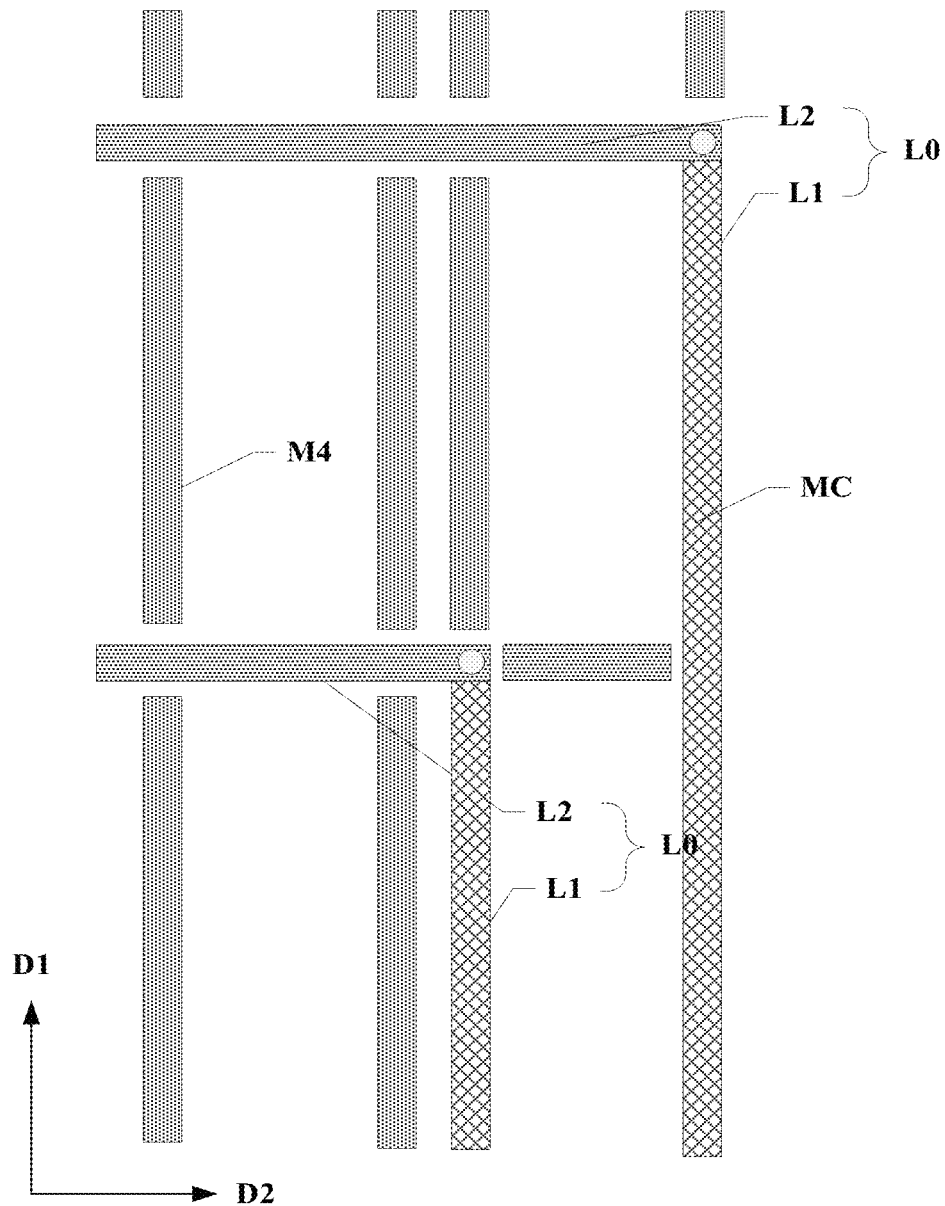
FIG. 29 is a schematic diagram of another partial layout of the film layer where the connecting line is located.

FIG. 29 is a schematic diagram of another partial layout of the film layer where the connecting line L0 is located, and FIG. 29 corresponds to the area where 2*2 pixel circuits are located. Referring to FIG. 24, FIG. 6, and FIG. 29. In some embodiments, the first connecting line segment L1 in each connecting line L0 may be arranged on the same layer, the second connecting line segment L2 in each connecting line L0 may be arranged on the same layer, and the first connecting line segment L1 and the second connecting line segment L2 may be arranged on different layers.

More specifically, this embodiment shows the technical solution that the first connecting line segment L1 and the second connecting line segment L2 in the connecting line L0 are respectively arranged in two film layers. In this way, there is no need to consider the phenomenon that the first connecting line segment L1 is short-circuited with a different second connecting line segment L2, and it is only necessary to electrically connect the first connecting line segment L1 to the corresponding second connecting line segment L2 through a vis hole. This arrangement is also beneficial to simplifying the wiring difficulty of the first connecting line segment L1 and the second connecting line segment L2. In this embodiment, the first connecting line segment L1 is located on the capacitor metal layer MC, and the second connecting line segment L2 is located on the fourth metal layer M4 as an example for illustration. In the same connecting line L0, the first connecting line segment L1 and the second connecting line segment L2 may be electrically connected through the connecting hole. Referring to FIG. 25, the first connecting line segment L1 in the connecting line L0 may be connected to the second fan-out line S2. In some embodiments, the second fan-out line S2 and the first connecting line segment L1 may be arranged on the same layer, and the second fan-out line S2 and the first connecting line segment L1 may both be located on the capacitor metal layer. In this way, the second fan-out line S2 and the first connecting line segment L1 can be wired in the same process to achieve electrical connection, without forming an electrical connection through other processes such as connection holes.

Referring to FIG. 6, FIG. 24, FIG. 28, and FIG. 29. In some embodiments, both the first connecting line segment L1 and the second connecting line segment L2 may be located in a non-opening area Q2 in the display area AA.

Referring to FIG. 6. The light-emitting layer 20 of the display panel may include a pixel definition layer 21, and the pixel definition layer 21 may define a plurality of pixel openings for evaporating light-emitting materials. The area where the orthographic projection of the pixel openings defined by the pixel definition layer 21 on the light-emitting surface of the display panel is located may be an opening area Q1 of the display panel, and other areas in the display area AA other than the opening area Q1 may be the non-opening areas Q2. An anode layer RE may be arranged below the pixel openings, and the light-emitting materials in the pixel openings may be in contact with the anode layer RE for receiving electrical signals. In the embodiments of the present disclosure, when the first connecting line segment L1 and the second connecting line segment L2 are introduced into the display panel, when the first connecting line segment L1 and the second connecting line segment L2 are arranged in the non-opening area of the display area AA, it is beneficial to avoid overlapping of the first connecting line segment L1 and the second connecting line segment L2 with the anode layer directly below the pixel opening. In this way, the first connecting line segment L1 and the second connecting line segment L2 can be preventing from affecting the flatness of the anode layer, which is beneficial to improving the overall display uniformity of the display panel.

It should be noted that the technical solution of arranging the first connecting line segment L1 and the second connecting line segment L2 in the non-opening area of the display panel is especially suitable for the technical solution in which the sub-pixels in the display panel are arranged in an array along the first direction D1 and the second direction D2.

Referring to FIG. 28. In some embodiments, the display panel may further include a plurality of first virtual line segments L01 extending along the first direction D1, and a plurality of second virtual line segments L02 extending along the second direction D2. The first virtual line segment L01 may be arranged on the same layer as the first connecting line segment L1 and the first virtual line segment L01 may be insulated from the first connecting line segment L1 and the second connecting line segment L2. The second virtual line segment L02 may be arranged on same layer as the second connecting line segment L2, and the second virtual line segment L02 may be insulated from the second connecting line segment L2 and the first connecting line segment L1.

More specifically, FIG. 28 illustrates a technical solution in which the first connecting line segment L1, the second connecting line segment L2, the first virtual line segment L01, and the second virtual line segment L02 are arranged on the same layer. In this embodiment, these line segments are arranged on the fourth metal layer M4 as an example for illustration. When the above line segments are arranged in the same film layer, these line segments may be formed in the same process, which is beneficial to simplifying the wiring process. In addition, if no virtual line segment is arranged on the film layer where the first connecting line segment L1 and the second connecting line segment L2 are located, and only the first connecting line segment L1 and the second connecting line segment L2 are arranged on the film layer where the first connecting line segment L1 and the second connecting line segment L2 are located, the metal density of the film layer will be uneven, which may cause the mura phenomenon due to the difference in the reflection effect of the metal in different areas. At the same time, the uneven metal density of the film layer may lead to poor uniformity of exposure and etching during the manufacturing process, resulting in uneven line width of the first connecting line segment L1 or the second connecting line segment L2, which in turn leads to greater differences in capacitive loads in different areas, which affects the display uniformity. In the embodiments of the present disclosure, the first virtual line segment L01 and the second virtual line segment L02 may be arranged on the film layer where the first connecting line segment L1 and the second connecting line segment L2 are locat4ed, the extension direction of the first virtual line segment L01 may be configured to be the same as the extension direction of the first connecting line segment L1, and the extension direction of the second virtual line segment L02 may be configured to be the same as the extension direction of the second connecting line segment L2. In this way, the uniformity of the metal density of the film layer where the first connecting line segment L1 and the second connecting line segment L2 are located can be improved, thereby improving screen mura phenomenon caused by uneven metal density, thereby improving the display uniformity of the display panel.

Figure 30:
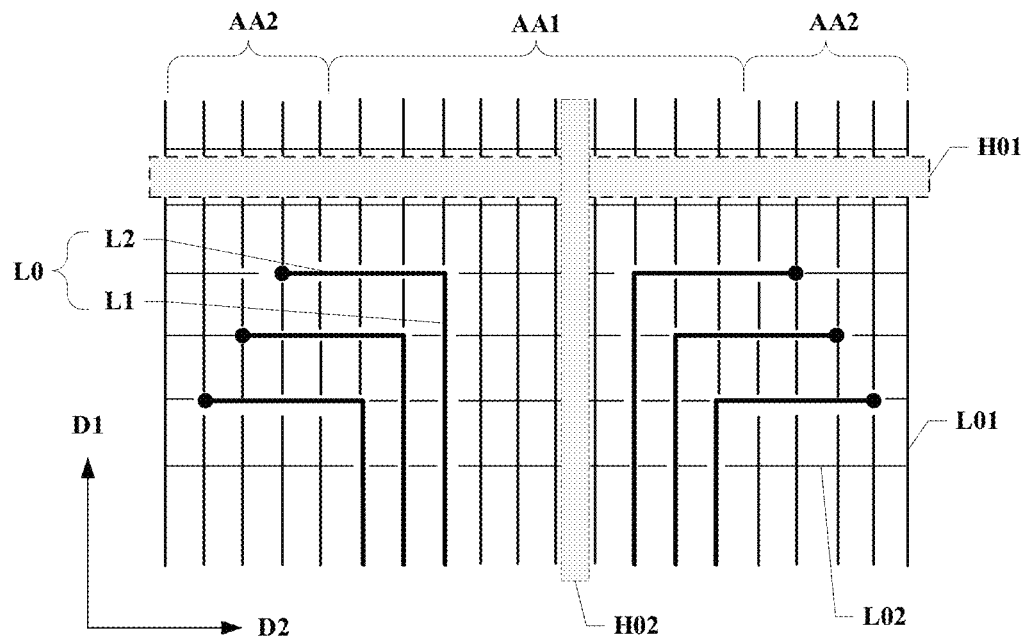
FIG. 30 is a schematic wiring diagram of the film layer where the first connecting line segment and a second connecting line segment are located.

FIG. 30 is a schematic wiring diagram of the film layer where the first connecting line segment and the second connecting line segment are located. Referring to FIG. 28 and FIG. 30. In some embodiments, the display panel may include a plurality of pixel rows H01 arranged along the first direction D1 and a plurality of pixel columns H02 arranged along the second direction D2; along the first direction D1, the number of pixel rows H01 included between adjacent second virtual line segments L02, between adjacent second virtual line segments L02 and second connecting line segments L2, and between adjacent second connecting line segments L2 may be the same; in the second direction D2, the number of pixel columns H02 included between adjacent first virtual line segments L01, between adjacent first virtual line segments L01 and first connecting line segments L1, and between adjacent first connecting line segments L1 may be the same.

More specifically, in this embodiment, the first connecting line segment L1, the second connecting line segment L2, the first virtual line segment L01, and the second virtual line segment L02 are being arranged on the same layer as an example for illustration, where the first connecting line segment L1 and the first virtual line segment L01 are extending along the first direction, and the second connecting line segment L2 and the second virtual line segment L02 are extending along the second direction D2. This embodiment further defines that the number of pixel columns H02 extending along the first direction included between two adjacent line segments is the same, such that the line segments extending along the first direction can be arranged at equal intervals or substantially at equal intervals. Further, this embodiment further defines that the number of pixel rows H01 included between two adjacent line segments extending along the second direction is the same, such that the line segments extending along the second direction can be arranged at equal intervals or substantially at equal intervals. In this way, the uniformity of the metal density on the metal film layer where the first connecting line segment L1 and the second connecting line segment L2 are located can be effectively improved, which is beneficial to improving or avoiding the mura phenomenon caused by uneven metal density. Further, the uniformity of the exposure and etching in the manufacturing process can be improved, which in turn helps to improve the uniformity of the line widths of the first connecting line segment L1 and the second connecting line segment L2 in different areas, thereby improving the display uniformity of the display panel.

It should be noted that the, in the embodiment shown in FIG. 30, only one pixel column H02 between two adjacent line segments extending along the first direction, and one pixel row H01 between two adjacent line segments extending along the second direction as an example for illustration. However, the present disclosure does not limit the number of pixel columns H02 included between two adjacent line segments extending along the first direction, nor does it limit the number of pixels rows included between two adjacent line segments extending along the second direction.

Referring to FIG. 28 and FIG. 30. In some embodiments, at least one first virtual line segment L01 may be floating; and/or, at least one second virtual line segment L02 may be floating.

More specifically, in order to simplify the manufacturing process, when the first connecting line segment L1 and the first virtual line segment L01 are arranged at the same time on the film layer where the first connecting line segment L1 is located, at least one first virtual line segment L01 introduced in the film layer may be floated, which does not need to be connected with other signal lines, thereby simplifying the manufacturing processes such as punching holes in the display panel. In some embodiments, in order to further simplify the manufacturing process, each first virtual line segment L01 in the film layer where the first connecting line segment L1 is located may be floating.

In some embodiments, when the second connecting line segment L2 and the second virtual line segment L02 are arranged at the same time on the film layer where the second connecting line segment L2 is located, at least one second virtual line segment L02 introduced in the film layer may be floated without connecting with other signal lines, which is beneficial to simplifying the manufacturing process such as punching holes in the display panel. In some embodiments, in order to further simplify the manufacturing process, each first virtual line segment L01 in the film layer where the first connecting line segment L1 is located may be floating.

Figure 31:
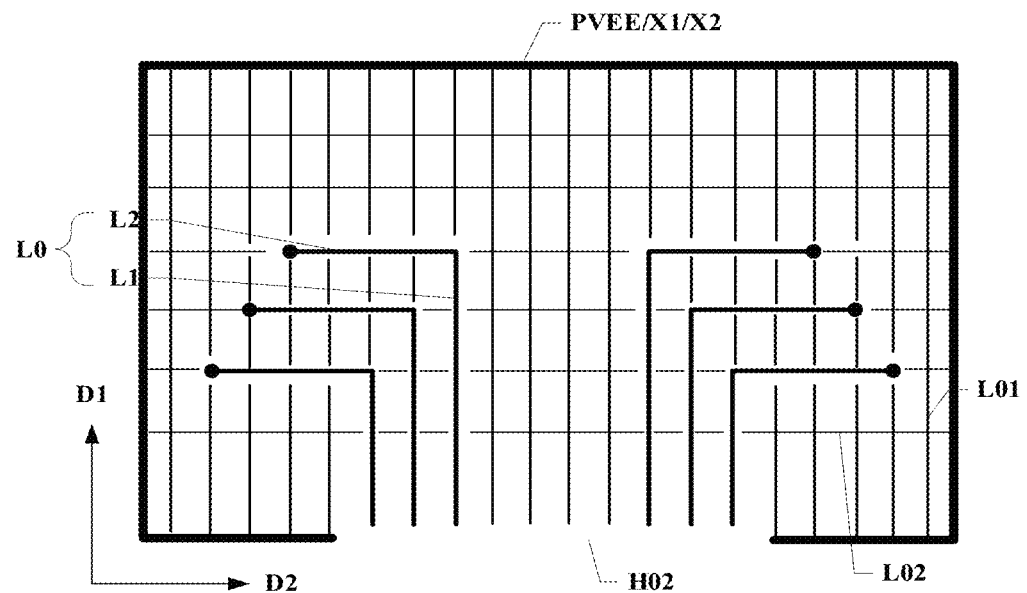
FIG. 31 is a schematic connection diagram between a first virtual line segment and a second virtual line segment and a fixed voltage line.

Referring to FIG. 18. In the display panel provided by the embodiments of the present disclosure, the signal lines connected to the pixel circuits may include signal lines for transmitting fixed voltage signals and signal lines for transmitting pulse signals. For example, the power signal line PVDD and the power signal lines PVEE may be used to transmit positive power signals and negative power signals respectively, and the electrical signals transmitted on the power signal line PVDD and the power signal lines PVEE may be fixed; the reset signal line Vref may be used to transmit reset signals, and the electrical signal transmitted on the reset signal line Vref may also be fixed. The signals transmitted on the first scan line Scan1, the second scan line Scan2, and the light-emitting control line Emit may be pulse signals. FIG. 31 is a schematic connection diagram between a first virtual line segment and a second virtual line segment and a fixed voltage line. In some embodiments, at least one first virtual line segment L01 may be electrically connected to a first fixed voltage line X1; and/or, at least one second virtual line segment may be electrically connected to a second fixed voltage line X2.

The first fixed voltage line X1 may be at least one of the power signal line PVDD, the power signal line PVEE, and the reset signal line Vref described above, and the second fixed voltage line X2 may be at least one of the power signal line PVDD, the power signal line PVEE, and the reset signal line Vref described above. In some embodiments, the first fixed voltage line X1 and the second fixed voltage line X2 may both be the power signal line PVDD, or may both be the power signal line PVEE, or may both be the reset signal line Vref, which is not limited in the embodiments of the present disclosure. In this embodiment, the first fixed voltage line X1 and the second fixed voltage line X2 are both power signal line PVEE as an example for illustration. In some embodiments, the power signal line PVEE may be disposed on the periphery of the display area. In this embodiment, at least part of the first virtual line segment L01 extending along the first direction D1 and at least part of the second virtual line segment L02 extending along the second direction D2 may be electrically connected to the power signal line PVEE. In this way, it is equivalent to connecting the impedance of the power signal line PVEE in parallel, which is beneficial to reducing the overall impedance of the power signal line PVEE and improving the uniformity of the signal transmitted by the power signal line PVEE.

It should be noted that FIG. 31 only illustrate the embodiment in which part of the first virtual line segment L01 and part of the second virtual line segment L02 are connected to the power signal line PVEE as an example for illustration. In some other embodiments of the present disclosure, the at least one first virtual line segment L01 and at least one second virtual line segment L02 may also be connected to a power signal line PVDD or a reset signal line Vref, which is not limited in the embodiments of the present disclosure.

Referring to FIG. 11. In some embodiments, the display panel may further include a fixed voltage signal line, such as a reset signal line Vref, and the fixed voltage signal line may include a line segment extending along the second direction D2. In addition, along the thickness direction of the display panel, the second connecting line segment L2 may at least partially overlap with a line segment extending along the second direction D2 in the fixed voltage signal line.

More specifically, when the connecting line L0 is introduced into the display panel, by arranging the orthographic projection of the first connecting line segment L1 extending along the first direction D1 in the connecting line L0 on the light-emitting surface of the display panel to at least partially overlap with the orthographic projection of the data line Data in the first display area AA1 on the light-emitting surface of the display panel, the crosstalk can be reduced while realizing the narrow frame design of the display panel. For the second connecting line segment L2 extending along the second direction D2 in the connecting line L0, in the embodiments of the present disclosure, the orthographic projection of the second connecting line segment L2 on the plane where the substrate of the display panel may be arranged to at least partially overlap with the orthographic projection of the line segment extending along the second direction D2 in the fixed voltage signal line in the display panel on the plane where the substrate is located. In this way, the influence on the aperture ratio of the display panel when the second connecting line segment L2 is introduced into the display panel can be reduced.

Referring to FIG. 6. In some embodiments, the display panel may include a substrate and a first metal layer M1, a capacitor metal layer MC, a second metal layer M2, a third metal layer M3, and a fourth metal layer M4 disposed on the substrate. Along the thickness direction of the display panel, the capacitor metal layer MC may be located on the side of the first metal layer M1 away from the substrate 00, and the second metal layer M2 may be located on the side of the capacitor metal layer MC away from the substrate 00. Further, the third metal layer M3 may be located on the side of the second metal layer M2 away from the substrate 00, and the fourth metal layer M4 may be located on the side of the third metal layer M3 away from the substrate 00. Referring to FIG. 9 and FIG. 10. In some embodiments, one of the data line Data and the first connecting line segment L1 may be located in the third metal layer M3, and the other may be located in the fourth metal layer M4.

More specifically, referring to FIG. 6, which shows a film layer structure of the display panel, where the first metal layer M1 can be, for example, a gate metal layer, and the gate of the transistor in the display panel may be arranged on the first metal layer M1. In some embodiments, the capacitor metal layer MC may be used to form a capacitor structure with the first metal layer M1 or the second metal layer M2. The display panel may further include a semiconductor layer poly, and the semiconductor layer poly may be located on the side of the first metal layer M1 away from the substrate 00, or on a side of the first metal layer M1 facing the substrate 00. The source electrode s and the drain electrode d of the transistor in the display panel may be located in the second metal layer M2, and the semiconductor layer poly may include a source region and a drain region. The source region and the drain region may be formed by doping N-type impurity ions or P-type impurity ions. The source electrode s of the transistor may be electrically connected to the source region of the semiconductor layer poly through a contact hole, and the drain electrode d of the transistor may be electrically connected to the drain region of the semiconductor layer poly through the contact hole. In some embodiments, signal wires or virtual wires may be laid on the second metal layer M2, the third metal layer M3, and the fourth metal layer M4. Referring to FIG. 6, FIG. 9, and FIG. 10. In some embodiments, the data lines Data in the first display area AA1 and the data lines Data in the second display area AA2 may be located in the same layer, such as the third metal layer M3. The first connecting line segment L1 may be located on the fourth metal layer M4, and the data lines Data may be used to electrically connect with some transistors in the display panel. When the data lines Data are arranged on the third metal layer M3, since the third metal layer M3 is arranged on the side of the fourth metal layer M4 facing the second metal layer M2, it is beneficial to realizing the connection between the data lines Data and the source or drain of the transistor.

Of course, in some other embodiments of the present disclosure, the connecting line L0 may also be arranged on the third metal layer M3, and the data lines Data may be arranged on the fourth metal layer M4.

Referring to FIG. 6, FIG. 9, and FIG. 10. In some embodiments, the second connecting line segment L2 may be located on at least one of the first metal layer M1, the capacitor metal layer MC, the third metal layer M3, and the fourth metal layer M4.

When the second connecting line segment L2 and the second connecting line segment L2 in the embodiments of the present disclosure are arranged on the same layer, the second connecting line segment L2 and the first connecting line segment L1 may both be arranged on the fourth metal layer M4, or the second connecting line segment L2 and the first connecting line segment L1 may both be arranged on the third metal layer M3.

When the second connecting line segment L2 and the first connecting line segment L1 in the embodiments of the present disclosure are arranged in different layers, when the first connecting line segment L1 is located in the fourth metal layer M4, the second connecting line segment L2 may be arranged on the third metal layer M3. In this way, the number of insulating layers between the first connecting line segment L1 and the second connecting line segment L2 can be reduced, which facilitates the perforated connection between the first connecting line segment L1 and the second connecting line segment L2. When the first connecting line segment L1 is located on the third metal layer M3, the second connecting line segment L2 may be arranged on the fourth metal layer M4. In this way, the number of insulating layers between the first connecting line segment L1 and the second connecting line segment L2 can also be reduced, which also facilitates the perforated connection between the first connecting line segment L1 and the second connecting line segment L2.

Of course, in some other embodiments of the present disclosure, the second connecting line segment L2 may also be arranged on the first metal layer M1 or the capacitor metal layer MC. In this way, the electrical connection between the first connecting line segment L1 and the second connecting line segment L2 can also be realized by punching holes. In addition, the second metal layer M2, which may be provided with signal lines for transmitting large voltage signals, may also be avoided, thereby avoiding or reducing the crosstalk phenomenon caused by the relatively large voltage signal to the second connecting line segment L2.

Referring to FIG. 6, FIG. 9, FIG. 10, and FIG. 18. In some embodiments, the display panel may further include a power signal line PVDD. In the display area AA, the power signal line PVDD may be located on at least one of the first metal layer M1, the capacitor metal layer MC, and the second metal layer M2.

The power signal line PVDD in the display panel may be used to transmit a power signal with a relatively large voltage value. In some embodiments, when the data line Data is arranged on the third metal layer M3 or the fourth metal layer M4, the power signal line PVDD may be arranged in the second metal layer M2 with a relatively large wiring space, thereby simplifying the wiring complexity of the power signal line. Considering that the power signal line PVDD transmits a power signal with a relatively large voltage value, its line width is generally set to be relatively large, and the data line Data and the connecting line L0 need to be connected through the connection hole. When the power signal line PVDD is arranged on the second metal layer M2, the data line Data and the connecting line L0 may be respectively arranged on the third metal layer M3 and the fourth metal layer M4 on the same side of the second metal layer M2 to facilitate the hole-punching connection between the data line Data and the connecting line L0, and avoid the power signal line PVDD from affecting the punching connection between the data line Data and the connecting line L0. Of course, since the first connecting line segment L1 and the second connecting line segment L2 are located on the third metal layer M3 or the fourth metal layer M4, the power signal line may also be arranged on the first metal layer M1 or the capacitor metal layer MC. In this way, the number of insulating layers between the film layer where the first connecting line segment L1 and the second connecting line segment L2 are located and the film layer where the power signal line is located can be increased, and the vertical distance between the connecting line L0 and the power signal line can be increased, thereby reducing the influence of the signal on the power signal line on the signal in the connecting line L0.

Figure 32:
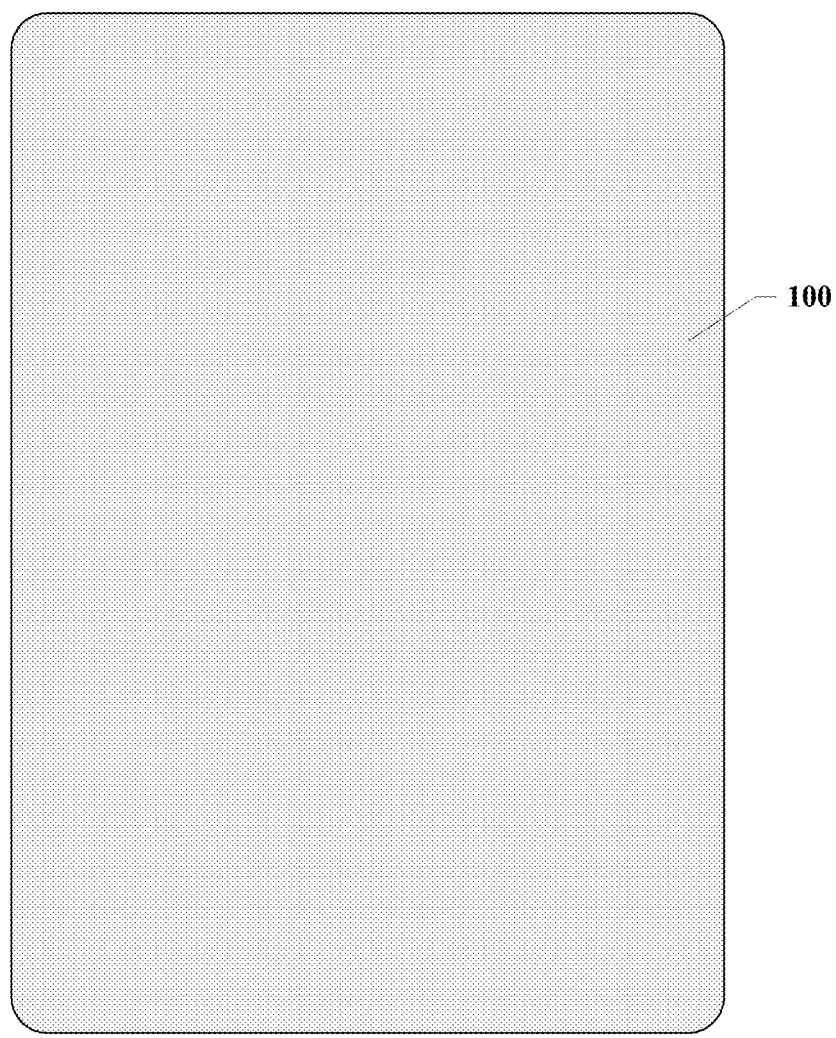
FIG. 32 is a schematic structural diagram of a display device according to an embodiment of the present disclosure.

Based on the same concept, an embodiment of the present disclosure further provides a display device. FIG. 32 is a schematic structural diagram of a display device 200 according to an embodiment of the present disclosure. Referring to FIG. 32, the display device 200 may include the display panel 100 provided by any one of the embodiments of the present disclosure described above.

It should be understood that the display device provided by the embodiments of the present disclosure may be a computer, a mobile phone, a tablet, or other display devices with a display function, which is not limited in the embodiments of the present disclosure. The display device provided by the embodiments of the present disclosure has the beneficial effect of the display panel provided by the embodiments of the present disclosure. For details, reference can be made to the specific descriptions of the display panel in the foregoing embodiments, which will not be repeated here.

Consistent with the present disclosure, the display panel and the display device provided by the embodiments of the present disclosure at least achieve the following beneficial effects. In the display panel and the display device provided by the embodiments of the present disclosure, the second display area in the display area may be located at least on one side of the first display area along the second direction, and the first fan-out area may be arranged on one side of the display area along the first direction. The data line in the first display area may directly extend to the position of the first fan-out area and may be electrically connected to the fan-out line in the first fan-out area, and the data line in the second display area may be electrically connected to the fan-out line in the first fan-out area through the connecting line in the display area. In the connecting line, the second connecting line segment extending along the second direction may be electrically connected to the data line in the second display area, and the first connecting line segment extending along the first direction may be electrically connected to the fan-out line in the first fan-out area. Further, along the thickness direction of the display panel, the first connecting line segment connected to the fa-out line may at least partially overlap with the data line in the first display area. That is, in the plurality of first connecting line segments corresponding to the data line in the second display area, most of the first connecting line segments may be located in the first display area. The data lines in the first display area and the second display area may be electrically connected to the fan-out line in the first fan-out area through the line segment of the first display area. In this way, there is no need to route the fan-out lines close to the lower left and/or lower right borders of the display panel, thereby providing a compressed space for the borders of the display panel and the display device, which is beneficial to realizing the further narrow frame design of the display panel and the display device, and improving the user experience. In addition, since the first connecting line segment can be electrically connected to the data line in the second display area, the first connecting line segment may also be used to transmit data signals. When the first connecting line segment and the data line in the first display area are arranged to be partially overlapping, it is beneficial to avoid the crosstalk phenomenon that may occur due to the large signal difference when the first connecting line segment overlaps with other signal lines extending along the first direction in the display panel to a certain extent, thereby improving the display effect of the display panel.

Although some specific embodiments of the present disclosure are described by examples in detail, those skilled in the art should understand that the above examples are only schematic and are not intended to limit the scope of the present disclosure. Those skilled in the art should understand that the above embodiments may be modified without deviating from the scope and spirit of the present disclosure. The scope of the disclosure is defined by the attached claims.

What is claimed is:

1. A display panel comprising:
   a display area including a first display area and a second display area; and
   a non-display area at least partially surrounding the display area, the non-display area including a first fan-out area located on one side of the display area along a first direction, the first fan-out area including a plurality of fan-out lines, wherein:
   the second display area is located on at least one side of the first display area along a second direction; both the first display area and the second display area include a plurality of data lines extending along the first direction and arranged along the second direction, the data lines being electrically connected to the fan-out lines, the data lines in the second display area being electrically connected to the fan-out lines through a connecting line, wherein:
   the connecting line is located in the display area and includes a first connecting line segment extending along the first direction and a second connecting line segment extending along the second direction, the first connecting line segment being electrically connected to the fan-out line, the second connecting line segment being electrically connected to the data line in the second display area; along a thickness direction of the display panel, the first connecting line segment at least partially overlaps with the data line in the first display area.

2. The display panel according to claim 1 further comprising:
   a plurality of data line groups, the data line group including X data line and X≥2; and
   a plurality of demultiplexing units, the demultiplexing unit being located on a side of the first fan-out area away from the display area, the demultiplexing unit including X switching elements, the switching elements including a plurality of control terminals, a plurality of input terminals, and a plurality of output terminals, the input terminals of the X switching elements of the same demultiplexing unit being connected, the output terminals of the X switching elements of the same demultiplexing unit being connected to the X data lines of the dame data line group in a one-to-one correspondence, the data line in the second display area being connected to the output terminal of the switching element through the second connecting line segment and the first connecting line segment; and X switch control lines, the control terminals of the X switching elements of the demultiplexing unit being connected to the X switch control lines in a one-to-one correspondence; wherein:
in the first connecting line segment and the data line at least partially overlap along the thickness direction of the display panel, the control terminal of the switching element connected to the first connecting line segment is connected to the same switch control line as the control terminal of the switching element connected to the data line.

3. The display panel according to claim 2 further comprising:
a plurality of pixel circuits arranged in an array, wherein:
in the pixel circuits located in the same column along the first direction, the pixel circuits located in odd rows share the same data line, and the pixel circuits located in even rows share the other data line; the data line electrically connected to the pixel circuits in the odd rows and the data line electrically connected to the pixel circuits in the even rows in the same column of pixel circuits are distributed on opposite sides of the pixel circuit in the column along the second direction.

4. The display panel according to claim 3, wherein:
along the thickness direction of the display panel, two first connecting line segments connected to the two data lines connected to the same column of pixel circuits in the second display area are respectively overlapped with two adjacent data lines in the first display area.

5. The display panel according to claim 2, wherein:
the demultiplexing unit includes a plurality of first demultiplexing units and a plurality of second demultiplexing units, the output terminal of the switching element in the first demultiplexing unit being electrically connected to the data line in the first display area through the fan-out line, the output terminal of the switching element in the second demultiplexing unit being electrically connected to the first connecting line segment corresponding to the data in the second display area through the fan-out line; and
the display panel further includes a demultiplexing unit setting area, the demultiplexing unit setting area including a first setting area and a second setting area, the second setting area being located on at least one side of the first setting area along the second direction, the first demultiplexing unit being located in the first setting area, the second demultiplexing unit being located in the second setting area.

6. The display panel according to claim 5, wherein:
the input terminals of the switching elements in the same demultiplexing unit are respectively electrically connected to different conductive pads; and
along the second direction, an arrangement order of the data line groups is the same as an arrangement order of the conductive pads corresponding to the demultiplexing units.

7. The display panel according to claim 5, wherein:
the fan-out line connected to the output terminal of the switching element in the first demultiplexing unit is a first fan-out line, the fan-out line connected to the output terminal of the switching element in the second demultiplexing unit is a second fan-out line, at least one second fan-out line and at least one first fan-out line are arranged in different layers.

8. The display panel according to claim 7, wherein:
at least one first fan-out line and the data line connected thereto are arranged on the same layer, at least one second fan-out line is arranged on the same layer as the first connecting line segment connected thereto.

9. The display panel according to claim 1 further comprising:
a power signal line disposed in the display area, the power signal line including at least a line segment extending along the first direction, wherein:
along the thickness direction of the display panel, at least part of the first connecting line segment does not overlap with the line segment extending along the first direction in the power signal line.

10. The display panel according to claim 1, wherein:
the first connecting line segment and the second connecting line segment in each of the connecting lines are arranged on the same layer.

11. The display panel according to claim 1, wherein:
the first connecting line segments in each of the connecting lines are arranged on the same layer, the second connecting line segments in each of the connecting lines are arranged on the same layer, and the first connecting line segments and the second connecting line segments are arranged in different layers.

12. The display panel according to claim 1 further comprising:
a plurality of first virtual line segments extending along the first direction and a plurality of second virtual line segments extending along the second direction, the first virtual line segments being arranged on the same layer as the first connecting line segments and insulated from the first connecting line segments and the second connecting line segments, the second virtual line segments being arranged on the same layer as the second connecting line segments, and insulated from the second connecting line segments and the first connecting line segments.

13. The display panel according to claim 12 further comprising:
a plurality of pixel rows arranged along the first direction and a plurality of pixel columns arranged along the second direction, wherein:
along the first direction a number of pixel rows included between adjacent second virtual line segments, between adjacent second virtual line segment and second connecting line segment, and between adjacent second connecting line segments is the same, and
along the second direction, a number of pixel columns included between adjacent first virtual line segments, between adjacent first virtual line segment and first connecting line segment, and between adjacent first connecting line segments is the same.

14. The display panel according to claim 12, wherein:
at least one of first virtual line segments is floating; and/or, at least one of second virtual line segments is floating.

15. The display panel according to claim 12, wherein:
at least one first virtual line segment is electrically connected to a first fixed voltage line; and/or, at least one second virtual line segment is electrically connected to a second fixed voltage line.

16. The display panel according to claim 1 further comprising:
a fixed voltage signal line, the fixed voltage signal line including a line segment extending along the second direction, wherein:
along the thickness direction of the display panel, the second connecting line segment at least partially overlaps with the line segment of the fixed voltage signal line extending along the second direction.

17. The display panel according to claim 1 further comprising:
- a substrate; and
- a first metal layer, a capacitor metal layer, a second metal layer, a third metal layer, and a fourth metal layer disposed on the substrate, wherein:
- along the thickness direction of the display panel, the capacitor metal layer is located on a side of the first metal layer away from the substrate, and the second metal layer is located on a side of the capacitor metal layer away from the substrate;
- the third metal layer is located on a side of the second metal layer away from the substrate, and the fourth metal layer is located on a side of the third metal layer away from the substrate; and
- one of the data line and the first connecting line segment is located on the third metal layer, and the other is located on the fourth metal layer.

18. The display panel according to claim 17, wherein:
the second connecting line segment is located in at least one of the first metal layer, the capacitor metal layer, the third metal layer, and the fourth metal layer.

19. The display panel according to claim 17 further comprising:
- a power signal line, wherein:
- in the display area, the power signal line is located on at least one of the first metal layer, the capacitor metal layer, and the second metal layer.

20. A display device comprising:
a display panel, the display panel including a display area including a first display area and a second display area; and a non-display area at least partially surrounding the display area, the non-display area including a first fan-out area located on one side of the display area along a first direction, the first fan-out area including a plurality of fan-out lines, wherein:
the second display area is located on at least one side of the first display area along a second direction; both the first display area and the second display area include a plurality of data lines extending along the first direction and arranged along the second direction, the data lines being electrically connected to the fan-out lines, the data lines in the second display area being electrically connected to the fan-out lines through a connecting line, wherein:
the connecting line is located in the display area and includes a first connecting line segment extending along the first direction and a second connecting line segment extending along the second direction, the first connecting line segment being electrically connected to the fan-out line, the second connecting line segment being electrically connected to the data line in the second display area; along a thickness direction of the display panel, the first connecting line segment at least partially overlaps with the data line in the first display area.

\* \* \* \* \*